(12) United States Patent
Doong et al.

(10) Patent No.: US 8,115,500 B2
(45) Date of Patent: Feb. 14, 2012

(54) ACCURATE CAPACITANCE MEASUREMENT FOR ULTRA LARGE SCALE INTEGRATED CIRCUITS

(75) Inventors: Yih-Yuh Doong, Hsin-Chu (TW); Keh-Jeng Chang, Hsin-Chu (TW); Yuh-Jier Mii, Hsin-Chu (TW); Sally Liu, Hsin-Chu (TW); Lien Jung Hung, Taipei (TW); Victor Chih Yuan Chang, Hsin-Chu (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 0 days.

(21) Appl. No.: 13/015,117

(22) Filed: Jan. 27, 2011

(65) Prior Publication Data

US 2011/0168995 A1    Jul. 14, 2011

Related U.S. Application Data

(62) Division of application No. 12/715,739, filed on Mar. 2, 2010, now Pat. No. 7,880,494, which is a division of application No. 11/966,653, filed on Dec. 28, 2007, now Pat. No. 7,772,868.

(60) Provisional application No. 60/947,269, filed on Jun. 9, 2007.

(51) Int. Cl.
    *G01R 31/28* (2006.01)
(52) U.S. Cl. ..................................... 324/687
(58) Field of Classification Search .................. None
    See application file for complete search history.

(56) References Cited

U.S. PATENT DOCUMENTS

| | | | |
|---|---|---|---|
| 5,761,080 A | 6/1998 | DeCamp et al. | |
| 5,773,317 A | 6/1998 | Wu et al. | |
| 5,828,580 A | 10/1998 | Ho | |
| 5,841,164 A * | 11/1998 | Tsujino et al. | 257/316 |
| 6,080,597 A | 6/2000 | Moon | |
| 6,084,285 A | 7/2000 | Shahani et al. | |
| 6,088,523 A | 7/2000 | Nabors et al. | |
| 6,185,722 B1 | 2/2001 | Darden et al. | |
| 6,219,631 B1 | 4/2001 | Oh et al. | |
| 6,243,653 B1 | 6/2001 | Findley | |
| 6,438,729 B1 | 8/2002 | Ho | |
| 6,457,163 B1 | 9/2002 | Yang | |
| 6,501,282 B1 * | 12/2002 | Dummermuth et al. | 324/679 |
| 6,539,526 B1 | 3/2003 | Deng | |
| 6,665,849 B2 | 12/2003 | Meuris et al. | |

(Continued)

OTHER PUBLICATIONS

Cho, D-H., et al., "Measurement and Characterization of Multi-Layered Interconnect Capacitance for Deep Submicron VLSI Technology," Proc. IEEE 1997 Int. Conference on Microelectronic Test Structures, vol. 10, Mar. 1997, pp. 91-94.

*Primary Examiner* — Paresh Patel
(74) *Attorney, Agent, or Firm* — Slater & Matsil, L.L.P.

(57) ABSTRACT

Test structures and methods for measuring contact and via parasitic capacitance in an integrated circuit are provided. The accuracy of contact and via capacitance measurements are improved by eliminating not-to-be-measured capacitance from the measurement results. The capacitance is measured on a target test structure that has to-be-measured contact or via capacitance. Measurements are then repeated on a substantially similar reference test structure that is free of to-be-measured contact or via capacitances. By using the capacitance measurements of the two test structures, the to-be-measured contact and via capacitance can be calculated.

11 Claims, 20 Drawing Sheets

U.S. PATENT DOCUMENTS

| | | |
|---|---|---|
| 6,728,942 B2 | 4/2004 | Lampaert et al. |
| 6,756,792 B2 | 6/2004 | Armbruster |
| 6,838,869 B1 | 1/2005 | Rogers et al. |
| 6,854,100 B1 | 2/2005 | Chuang et al. |
| 6,870,387 B2 | 3/2005 | Huang et al. |
| 6,880,142 B2 | 4/2005 | Cui et al. |
| 6,885,207 B2 | 4/2005 | Chan et al. |
| 6,885,214 B1 | 4/2005 | Su et al. |
| 7,089,516 B2 | 8/2006 | Arora et al. |
| 7,139,990 B2 | 11/2006 | Singh et al. |
| 7,230,435 B2 | 6/2007 | Kunikiyo et al. |
| 7,231,618 B2 | 6/2007 | Huang et al. |
| 7,263,477 B2 | 8/2007 | Chen et al. |
| 7,320,116 B2 | 1/2008 | Mukaihira |
| 7,348,624 B2 | 3/2008 | Sakaguchi et al. |
| 7,355,201 B2 | 4/2008 | Zhu et al. |
| 7,712,068 B2 | 5/2010 | Ren et al. |
| 7,818,698 B2 | 10/2010 | Su et al. |
| 2001/0025966 A1* | 10/2001 | Mizuhara .................. 257/194 |
| 2002/0188920 A1 | 12/2002 | Lampaert et al. |
| 2003/0122123 A1 | 7/2003 | Deng et al. |
| 2003/0206033 A1 | 11/2003 | Chan et al. |
| 2004/0078765 A1 | 4/2004 | Cui et al. |
| 2004/0207412 A1 | 10/2004 | Kunikiyo et al. |
| 2005/0024077 A1 | 2/2005 | Huang et al. |
| 2005/0216873 A1 | 9/2005 | Singh et al. |
| 2005/0240883 A1 | 10/2005 | Huang et al. |
| 2005/0260776 A1 | 11/2005 | Wang et al. |
| 2006/0107246 A1 | 5/2006 | Nakamura |
| 2006/0271888 A1 | 11/2006 | Meuris et al. |
| 2007/0087719 A1 | 4/2007 | Mandal et al. |
| 2007/0198967 A1 | 8/2007 | Ren et al. |
| 2008/0320428 A1 | 12/2008 | Lin |
| 2009/0077507 A1 | 3/2009 | Hou et al. |
| 2009/0184316 A1 | 7/2009 | Hsu et al. |

* cited by examiner

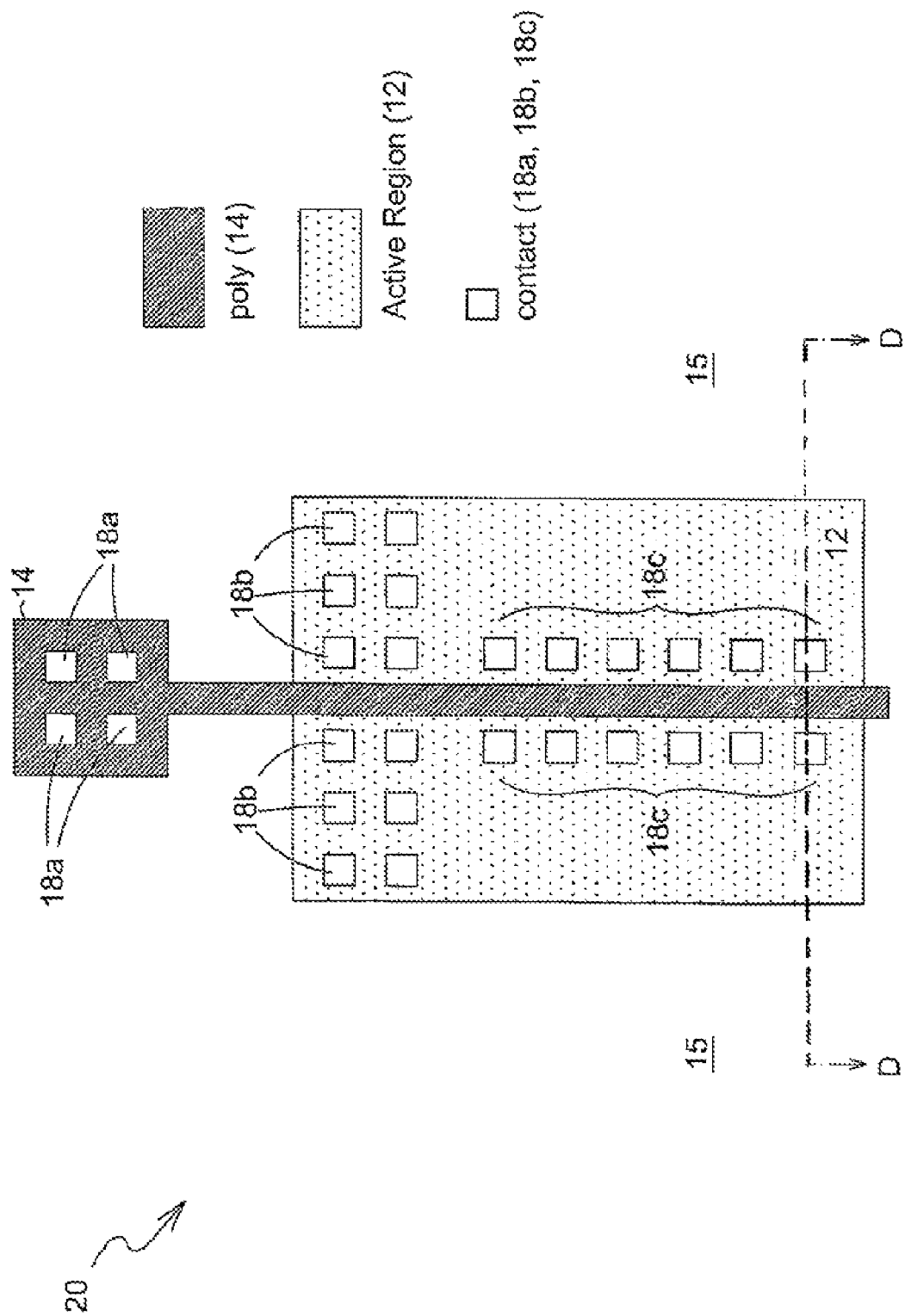

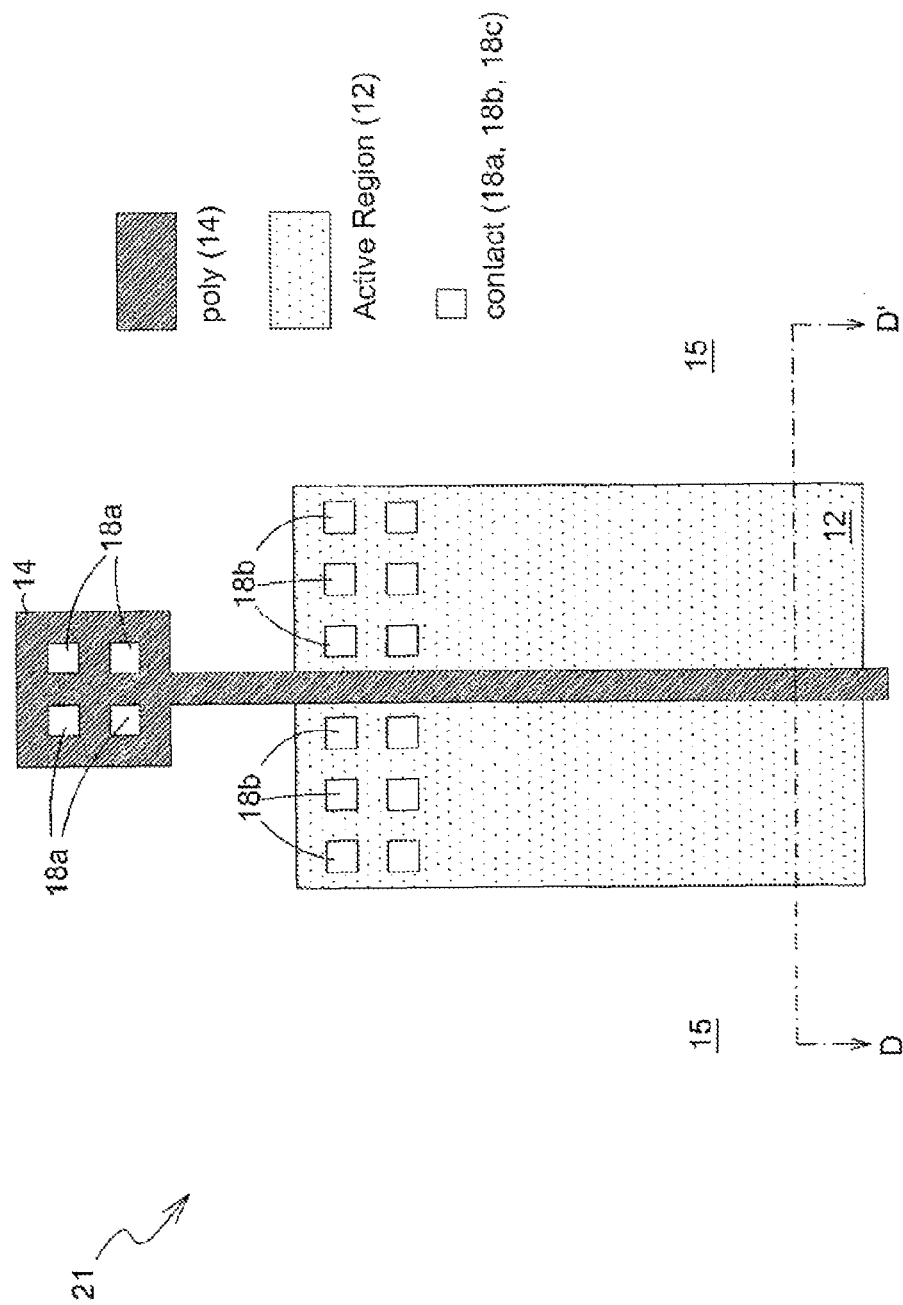

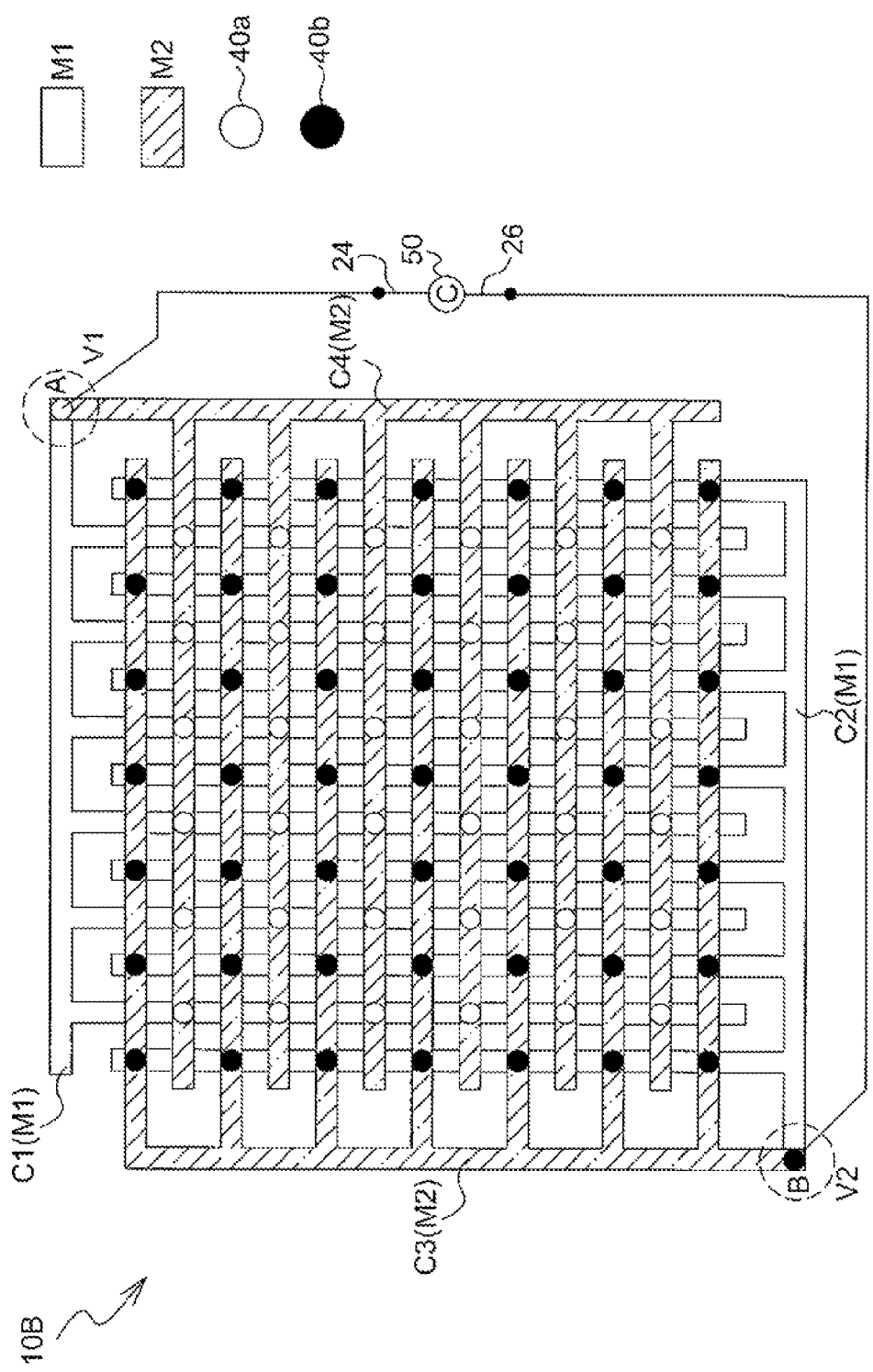

ACCURATE CAPACITANCE MEASUREMENT FOR ULTRA LARGE SCALE INTEGRATED CIRCUITS

This application is a divisional of and claims priority to U.S. patent application Ser. No. 12/715,739, filed on Mar. 2, 2010, and entitled "Accurate Capacitance Measurement for Ultra Large Scale Integrated Circuits," which is a divisional of U.S. patent application Ser. No. 11/966,653, filed Dec. 28, 2007, now issued as U.S. Pat. No. 7,772,868, and entitled "Accurate Capacitance Measurement for Ultra Large Scale Integrated Circuits," which claims priority to U.S. Provisional Patent Application No. 60/947,269, filed on Jun. 29, 2007, and entitled "Method and System to Enable Design Optimization of Via and Contact," which applications are hereby incorporated herein by reference.

CROSS-REFERENCE TO RELATED APPLICATIONS

This application relates to the following commonly assigned U.S. patent application Ser. No. 11/865,304, filed on Oct. 1, 2007, now issued as U.S. Pat. No. 7,818,698, and entitled "Accurate Parasitic Capacitance Extraction for Ultra Large Scale Integrated Circuits," which application is hereby incorporated herein by reference.

TECHNICAL FIELD

The present invention relates generally to techniques of parametric measurements in an integrated circuit, and more particularly, to on-chip test structures, and corresponding method of measuring contact and via parasitic capacitance in a semiconductor device.

BACKGROUND

As the density of integrated circuits continues to increase, the scaling down of the semiconductor device feature sizes in integrated circuits ("ICs") has followed. This trend poses continuous technical challenges in manufacturing ICs with improved performance. For example, it has been widely recognized that, when device feature sizes shrink down to the ultra-deep submicron range (less than 0.25 micron), interconnect (also generally referred to as "net") delays between devices in an IC, due to parasitic resistance/capacitance on the nets, begin to dominate the overall time delay in an IC. As a consequence, significant efforts have been taken by IC design engineers in extracting parasitic net capacitance by improved accuracy so that IC designers can predict the impact of the parasitic effects in an early design stage and compensate for these detrimental effects through proper design optimization steps.

Currently, extraction efforts are mainly focused on the coupling capacitance between adjacent nets. Accurate models have been developed for predicting time delays due to net-to-net parasitic capacitance. However, the parasitic capacitance associated with the contacts and vias, which are formed in an IC to couple a net with a device node and to connect nets in different interconnect layers, is either ignored or estimated with poor accuracy. When the trend of device scaling in an IC continues, the existing extraction methodology is problematic for various reasons. Firstly, contact and via capacitance accounts for a significantly increased proportion of the total interconnect delay in ICs made with advanced technology, due to the reduced contact-to-gate-electrode spacing and increased contact and via density. Interconnect parasitic extraction ignoring parasitic effects on contacts and vias may lead to significant discrepancy between circuit simulation results and the actual circuit performance.

Secondly, in existing parasitic extraction system, a per-unit contact and via capacitance value derived from an ideal, square-shaped contact and via primitive is typically used to calculate the contact and via parasitic capacitance in an IC. The aforementioned per-unit contact and via capacitance value is typically calculated by a field solver, and the actual contact/via shapes and size variations due to IC manufacturing process variation are generally ignored. This may, in turn, lead to inaccurate parasitic extraction on contacts and vias in an actual IC. In existing practices, the contact-to-gate-electrode capacitance in an IC is generally overestimated, while the via-to-via capacitance in an IC is typically underestimated by a margin of as large as about 10% in certain circumstances.

In view of the foregoing, it has become very important to perform parasitic extraction in an IC with the actual contact/via shapes and size variations in consideration. This is accomplished through the invention fully described in the commonly assigned patent application Ser. No. 11/865,304 filed on Oct. 1, 2007, entitled "Accurate Parasitic Capacitance Extraction for Ultra Large Scale Integrated Circuits", which application is hereby incorporated herein by reference. In the aforementioned reference, contact and via capacitance models are developed for contacts and vias occurring in an actual IC. Each contact and via model possesses an ideal contact and via configuration (e.g., square shape without taped cross-sectional dimension) recognizable by the existing extraction tools, while having a matching capacitance with that of an actual contact and via. The capacitance matching is performed through mapping an actual contact/via configuration occurring in an IC into an ideal, square-shaped, extracting-tool-recognizable contact/via configuration having an "effective (contact/via) width." Using capacitance models thus created, parasitic extraction on an IC in an existing extracting system and the circuit simulation based there upon will match with the actual performance of an IC. Nevertheless, creating the desired contact and via models requires first and foremost making accurate measurement of parasitic capacitance on contact and via that have the shapes and size variations occurring in an actual IC.

FIG. 1 illustrates a schematic cross-section view of a known test structure used in measuring contact-to-gate-electrode capacitance $C_{co\_po}$ on an MOSFET transistor occurring in an IC. FIG. 1 shows one unit of interest on a contact-to-gate-electrode capacitance test structure for clearer view. In practice, a large number of units typically present in a test structure in order to bring the capacitance of interest to a measurable scale, since capacitance on a single unit is negligibly small when compared to other capacitance components in an IC. Contacts "c" are formed coupling a metal wire M1 in the first interconnect layer with the source/drain regions "s" and "d," respectively. A known capacitance meter coupling to the gate electrode "g" and one of the M1 wires is used to measure the contact-to-gate-electrode capacitance, labeled as $C_{co\_po}$ in FIG. 1. However, this prior art test structure and method of measuring $C_{co\_po}$ suffer from significant deficiencies because, besides the to-be-measured contact-to-gate-electrode capacitance $C_{co\_po}$, the gate-to-metal capacitance $C_{g-m1}$, the junction capacitance $C_{gs}$, and the metal-to-metal capacitance $C_{m1\_m1}$ are inevitably introduced into the measurements.

SUMMARY OF THE INVENTION

These and other problems are generally solved or circumvented, and technical advantages are generally achieved, by embodiments of the present invention which provides test structures and methods of making contact and via capacitance measurement with improved accuracy.

In accordance with an embodiment of the present invention, a method of measuring parasitic capacitance in a semiconductor is provided. The method includes providing a first test structure comprising a first conductive comb structure and a second conductive comb structure complementary to the first comb, each of said first and second conductive comb structures being formed in a first interconnect layer, and a third conductive comb structure and a fourth conductive comb structure complementary to the third comb, each said third and fourth conductive comb structures being formed in a second interconnect layer. The first conductive comb structure couples with the fourth conductive comb structure through a first plurality of to-be-measured via formed at the cross-over regions of the first and the fourth conductive comb structures, and the second conductive comb structure couples with the third conductive comb structure through a second plurality of to-be-measured via formed at the cross-over regions of the second and the third conductive comb structures. The method further includes applying a first bias to the first and the fourth conductive comb structures, and a second bias to the second and the third conductive comb structures, measuring a first capacitance on said first test structure between said first bias and said second bias, and providing a second test structure comprising a fifth conductive comb structure and a sixth conductive comb structure complementary to the fifth conductive comb structure, both being formed in the first interconnect layer, and a seventh conductive comb structure and an eighth conductive comb structure complementary to the seventh conductive comb structure, both being formed in the second interconnect layer. Further, the fifth and the eight conductive comb structures are substantially similar to the first and the fourth conductive comb structures, respectively, being free of to-be-measured vias formed between the fifth and the eight conductive comb structures. The sixth and the seventh conductive comb structures are substantially similar to the second and the third conductive comb structures, respectively, being free of to-be-measured vias formed between the sixth and the seventh conductive comb structures. The method further includes applying the first bias to the fifth and the eight conductive comb structures, and the second bias to the sixth and the seventh conductive comb structures, measuring a second capacitance on the second test structure between the first bias and the second bias, and calculating a parasitic capacitance $C_v$ of to-be-measured via using said first and said second capacitances.

In accordance with another embodiment of the present invention, a method of a test structure formed on an semiconductor substrate for measuring the parasitic capacitance between a via and adjacent conductive features of a semiconductor device is provided, said test structure comprising a first conductive comb structure and a second conductive comb structure complementary to the first comb structure, each of said first and said second conductive comb structures being formed in a first interconnect layer. The test structure further includes a third conductive comb structure and a fourth conductive comb structure complementary to the third comb structure, each of said third and said fourth conductive comb structures being formed in a second interconnect layer. A first plurality of to-be-measured via formed at the cross-over regions of said first conductive comb structure and said fourth conductive comb structure, electrically coupling said first conductive comb structure with said fourth conductive comb structure is included. A second plurality of to-be-measured via formed at the cross-over regions of said second conductive comb structure and said third conductive comb structure, electrically coupling said second conductive comb structure with said third conductive comb structure is also included.

An advantage of a preferred embodiment of the present invention is that parasitic capacitance associated with contact and via in an IC can be measured with substantially improved accuracy. This is achieved by eliminating the effects of the not-to-be-measured capacitances from the measurement results through a first capacitance measurement on a target test structure and a second capacitance measurement on a reference test structure. Contact and via capacitance models created from there upon will provide matching capacitances with the contacts and vias in an actual IC.

BRIEF DESCRIPTION OF THE DRAWINGS

For a more complete understanding of the present invention, and the advantages thereof, reference is now made to the following descriptions taken in conjunction with the accompanying drawings, in which:

FIG. 5A is a layout view showing the contact configuration in a unit cell of a target DUT for contact capacitance measurement in a preferred embodiment;

FIG. 6A is a layout view showing the contact configuration in a unit cell of a reference DUT corresponding to the unit cell of a target DUT described with respect to FIG. 5A;

FIG. 7A is a schematic layout view illustrating the configuration of a target DUT used for via capacitance measurement in one preferred embodiment;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely contact and via capacitance test structures and methods of conducting contact and via capacitance measurement in an IC. A common feature of the various embodiments of the current invention is to eliminate the not-to-be-measured capacitances from the measurement results through proper design on test structures and measuring procedures. Contact and via capacitance measurements made by preferred test structures and methods result in significantly improved measurement accuracy. As a result, contact and via capacitance models created through the methods disclosed in the commonly assigned patent application Ser. No. 11/865,304 filed on Oct. 1, 2007, entitled "Accurate Parasitic Capacitance Extraction for Ultra Large Scale Integrated Circuits", can lead to a layout contact and via parasitic capacitance extraction well matched with the capacitance on an actual contact and via in an IC. The details of the preferred embodiments will be described as the following.

Figure 1:
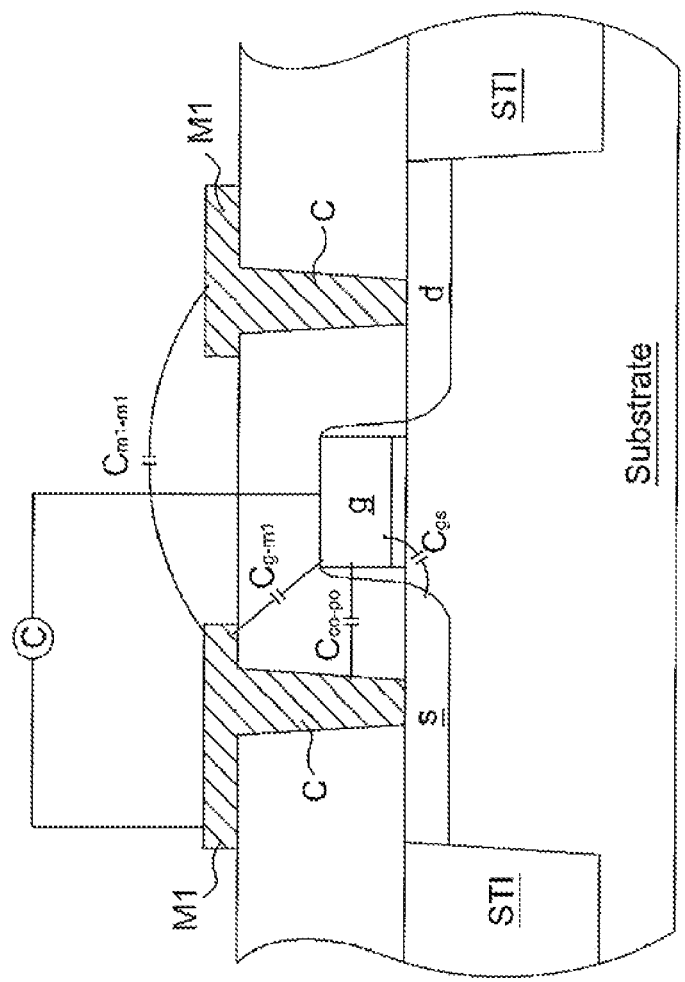
FIG. 1 illustrates a schematic cross-section view of a prior art test structure used in measuring contact-to-gate-electrode capacitance in an IC.
Figure 2:
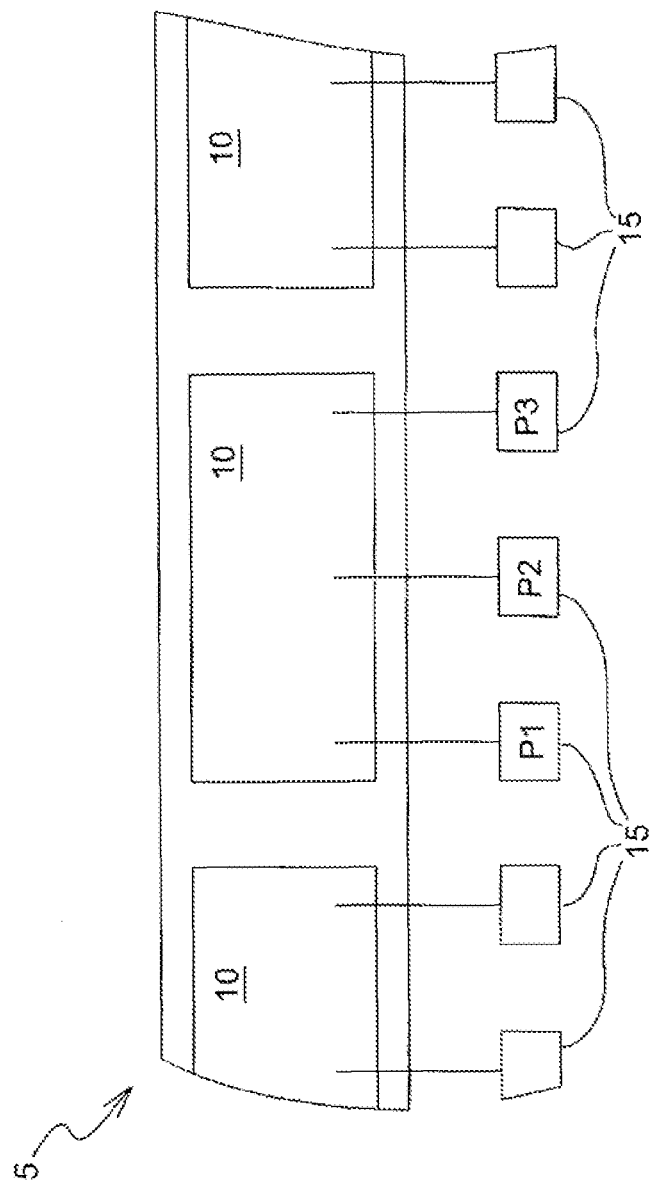
FIG. 2 illustrates a plan view of a portion of a testline comprising contact and via capacitance test structures in preferred embodiments.

FIG. 2 illustrates a plan view of a portion of testline 5 configured according to one embodiment of the present invention. Testline 5 is formed on a semiconductor wafer substrate (not shown), such as doped silicon, silicon germanium, gallium arsenide, compound semiconductor, multi-layers semiconductor, silicon-on-insulator (SOI), and any combination thereof. Testline 5 comprises a plurality of test structures 10 of various configurations used in making accurate contact and via parasitic capacitance measurements. Test structures 10 may be interchangeably referred to as device-under-test (DUT) 10 throughout the following description. Also shown in FIG. 2 is a serial number of aligned test pads 15, such as P1, P2, and P3. Test pads 15 are formed with metal or other electrically conductive materials using known semi-conductor processing techniques. Test pads 15 are electrically coupled to DUTs 10, and are used to apply test stimuli to and retrieve responses from selected DUTs 10. Test pads 15 may be formed beside DUTs 10 (as shown) or above DUTs 10 through known manufacturing processes. By studying and comparing the measured capacitances on DUTs 10 of various contact and via configurations, it is possible to obtain contact-to-gate-electrode and via capacitance with improved accuracy and precision, which may, in turn, lead to better contact and via models for accurate circuit simulations.

Figure 3:
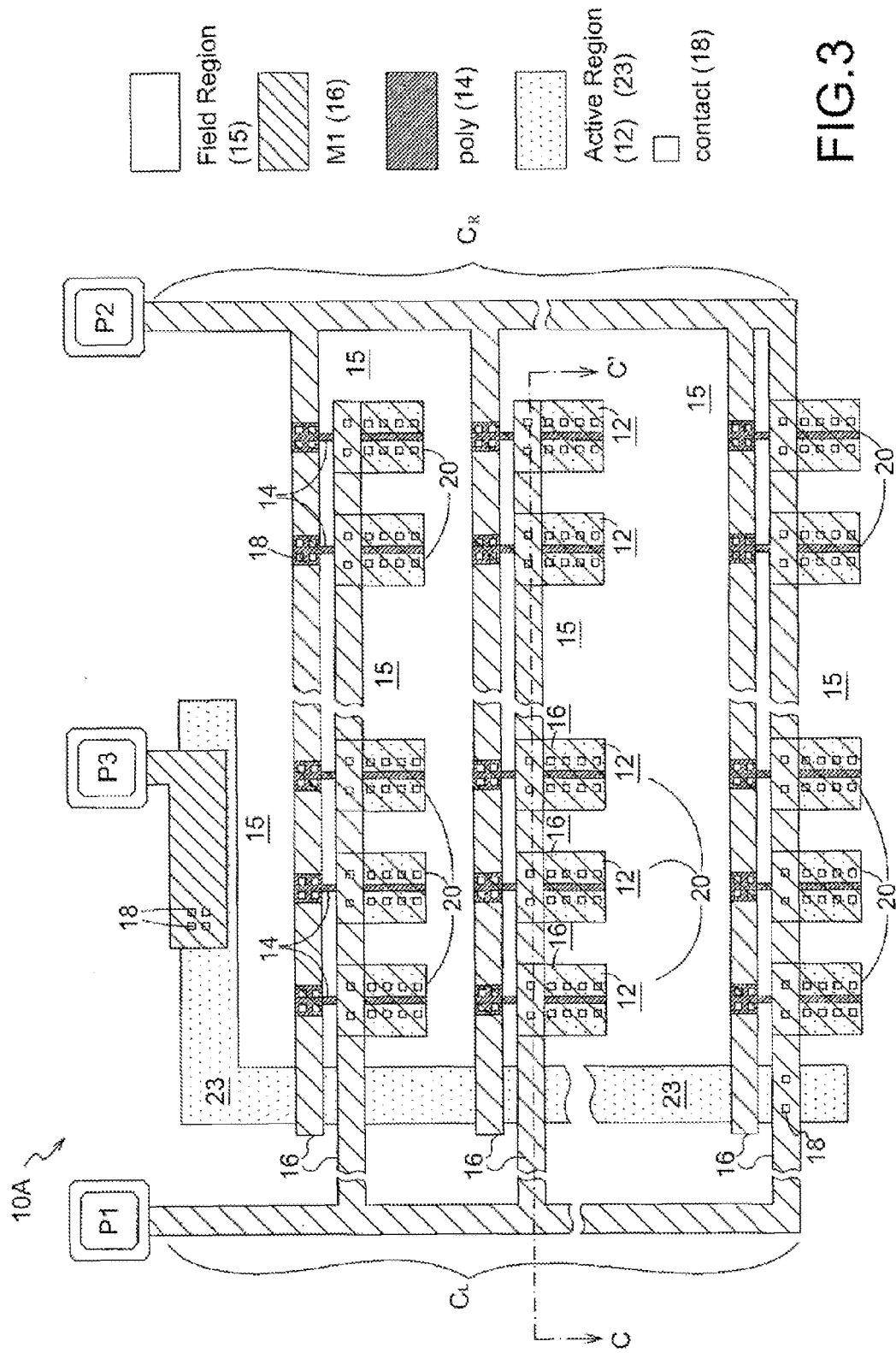
FIG. 3 is a schematic layout view illustrating the configuration of a DUT used for contact-to-gate-electrode capacitance measurement in one preferred embodiment.

FIG. 3 is a schematic layout view illustrating the configuration of one type of DUT 10, namely 10A, used for contact-to-gate-electrode capacitance measurement in one preferred embodiment. As can be seen from FIG. 3, DUT 10A comprises an array of DUT unit cells 20, each including active region 12 formed in a semiconductor substrate (not shown), gate electrode 14 formed atop active region 12, and conductive layer 16 formed in the first interconnect layer (M1) overlying active region 12 and gate electrode 14. In preferred embodiments, gate electrode 14 may be formed by known gate electrode materials and processes, such as a polysilicon layer formed and patterned over a gate dielectric layer. M1 conductive layer 16 is electrically isolated from gate electrode 14 and active region 12 by a first dielectric layer ILD_I. An active region 12 is electrically isolated from an adjacent active region 12 through isolation region 15 formed in the substrate by known techniques, such as field isolation or shallow trench isolation (STI). In a preferred embodiment, DUT 10A includes a 100 by 100 array of unit cells 20, having a total number of unit cells of 10,000.

DUT 10A also comprises two complementary conductive comb structures "$C_L$" and "$C_R$," coupled to first test pad P1 and second test pad P2, respectively. "$C_L$" and "$C_R$" are preferably formed by M1. Gate electrode 14 of each DUT unit cell 20 is electrically coupled to "$C_R$" through contacts 18. M1 conductive layer 16 of each DUT unit cell 20 is electrically coupled to comb structure "$C_L$." When M1 is used to make comb structure "$C_L$," "$C_L$" and conductive layer 16 may be formed by common known process steps. DUT 10A further comprises active region 23 formed along the edges of DUT 10A, coupled to third test pad P3. Active region 23 and active region 12 have a similar conductivity and may be formed simultaneously through common known process steps. Moreover, active region 23 and active region 12 of each DUT unit cell 20 are electrically connected together through contacts 18 presented between active regions 12, 23, and the M1 fingers of comb structure "$C_L$," as shown.

Figure 4:
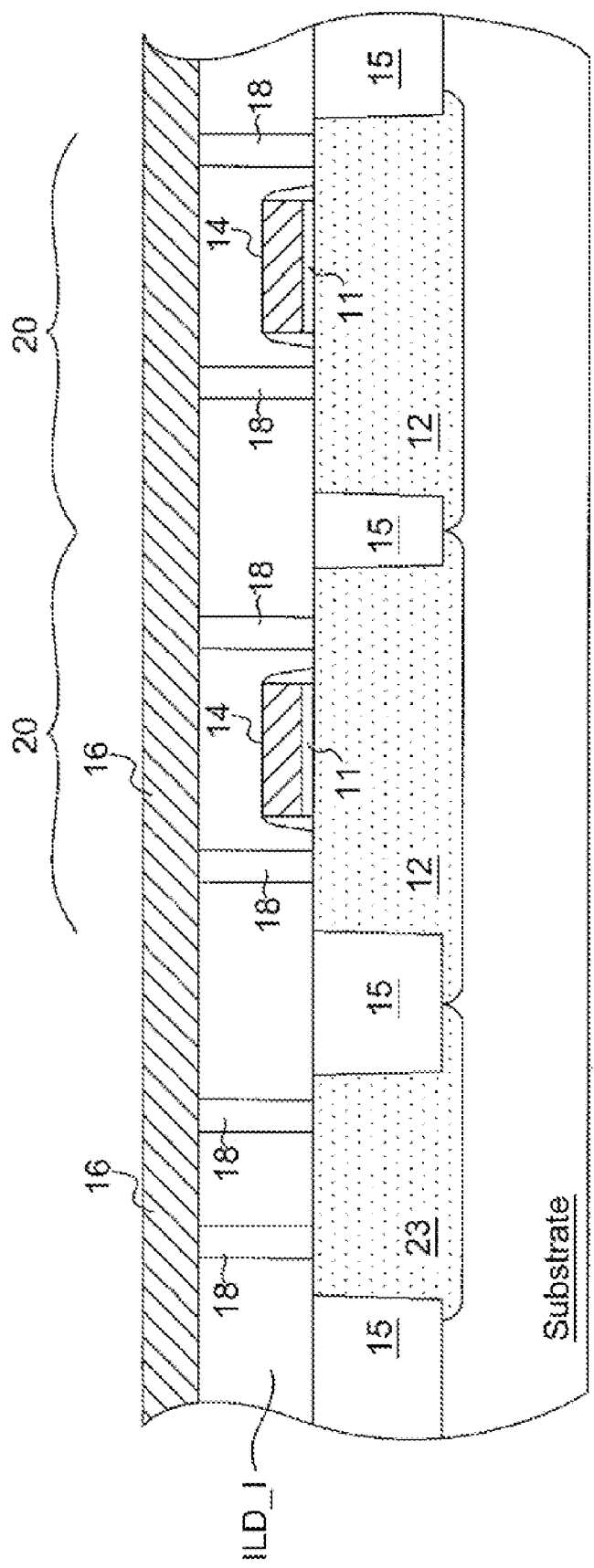
FIG. 4 shows a portion of a cross-sectional view of the DUT in FIG. 3 in the area noted as C-C'.

FIG. 4 shows a portion of a cross-sectional view of DUT 10A in the area noted as C-C' in FIG. 3, further illustrating the various features described above. It can be seen that, in the region of DUT unit cell 20, conductive layer 16 and active region 12 are electrically connected through contacts 18, but isolated from gate electrode 14 through ILD_I and gate dielectric layer 11. Further, active regions 12 in the DUT array region and active region 23 along the DUT edge are electrically connected through M1 conductive layer 16 and contacts 18.

FIG. 5A is an expanded layout view showing, among other features, the contact configuration in DUT unit cell 20 of DUT 10A as described above with respect to FIG. 3. For clearer view, M1 layers overlying gate electrode 14 and active region 12 are not shown. FIG. 5A reveals that contacts used in making electrical connections between the various conductive features in DUT unit cell 20 comprise three major groups. The first contact group comprises contacts 18a that couple gate electrode 14 to M1 finger (see FIG. 3) of comb structure "$C_R$." The second contact group comprises contacts 18b that connect active region 12 to M1 finger of comb structure "$C_L$." Contacts 18a and 18b are primarily used in making electrical connections between gate electrode 14 and test pad P2, and between active region 12 and test pad P1, respectively (see FIG. 3). Thus, the sizes and configurations of contacts 18a and 18b are less significant and should not be limited to those shown in FIG. 5A, so long as contacts 18a and 18b provide desired electrical connections as described above.

The third contact group comprises contacts 18c that are formed between active region 12 and M1 conductive layer 16. Contact 18c are aligned with and evenly distributed along both sides of gate electrode 14. Preferably, contacts 18c are used to model the contacts that are actually occurring in an IC. Thus, the contact size, contact density and contact-to-gate-electrode spacing of contacts 18c are representative of those that are used in connecting MOSFET (Metal-Oxide-Silicon Field Effect Transistor) devices in an actual IC product. In preferred embodiments, a DUT having a contact or via to be modeled and measured is also generally referred to as a target DUT, or a target test structure.

In FIG. 5A, the size of each of contacts 18c has a minimum design rule size in correspondence with a certain technology generation. The contact density (typically measured in contact-to-contact spacing) and contact-to-gate electrode spacing of contacts 18c have the maximum design rule contact density and minimum design rule contact-to-gate-electrode spacing, respectively. This contact configuration is representative of the vast majority of contact configurations used in an actual IC. In order to model other contact configurations used in an IC, contacts 18c may also have a contact density and contact-to-gate-electrode spacing that are, for example, multiple of the minimum design rule contact-to-contact and contact-to-gate-electrode spacing, respectively.

Figure 5B:
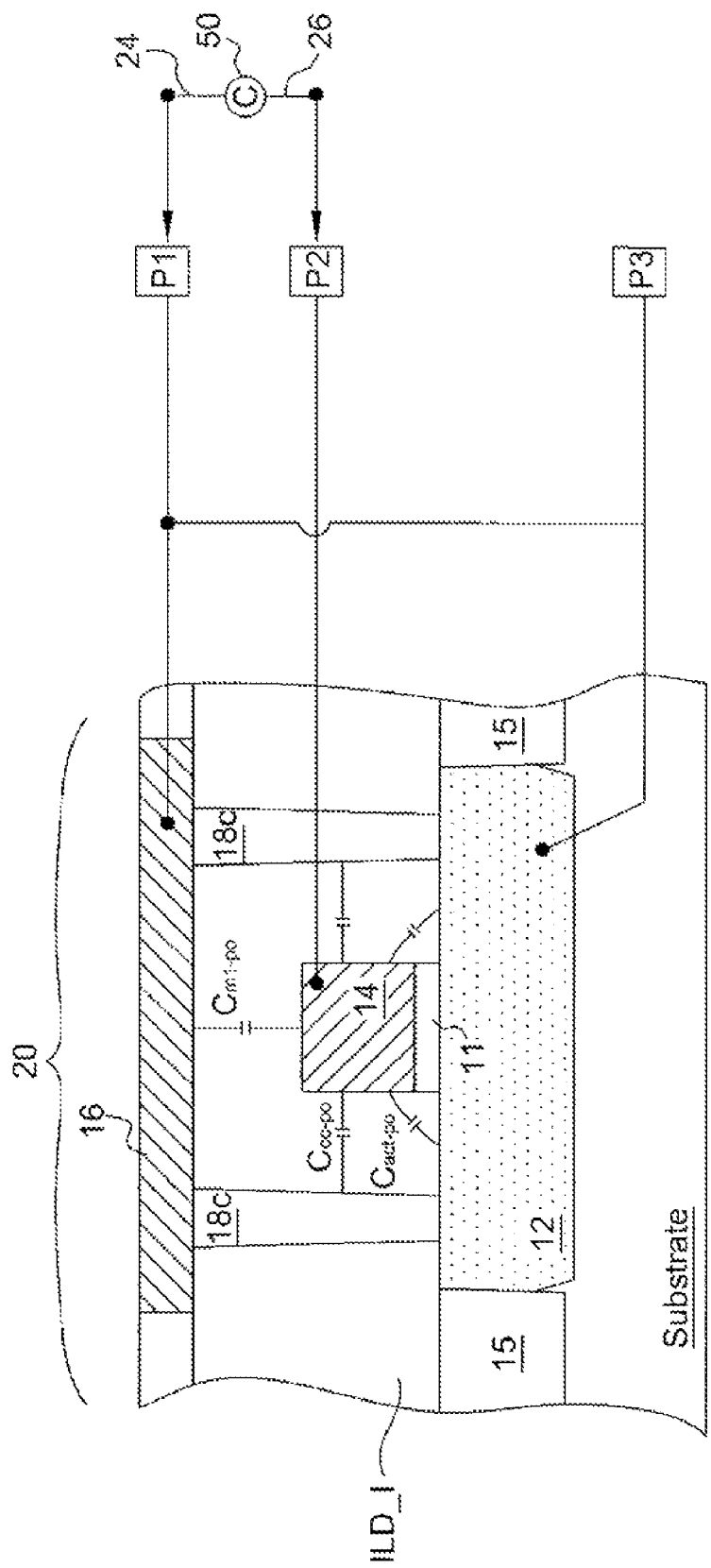
FIG. 5B is a schematic cross-sectional view of DUT unit cell in FIG. 5A in the area noted as D-D'.

FIG. 5B is a schematic cross-sectional view of DUT unit cell 20 in FIG. 5A in the area noted as D-D.' It is noted that M1 conductive layer 16 omitted in FIG. 5A is shown herein. FIG. 5B includes the electrical connections making into the various conductive regions of DUT unit cell 20 when making desired $C_{co-po}$ measurements in preferred embodiments. Also illustrated in FIG. 5B are parasitic capacitances in DUT unit cell 20 when it is under preferred measurement conditions.

The method of making desired $C_{co-po}$ measurement will now be described with respect to FIG. 5B. It is shown in FIG. 5B that, when making $C_{co-po}$ measurement in preferred embodiments, test pads P1 and P3 are coupled to drive (high) end 24 of a known LCR (inductance-capacitance-resistance) meter 50, having a first DC voltage bias. Test pad P2 is coupled to sense (low) end 26 of LCR meter 50, having a second DC voltage bias. Under this bias condition, conductive layer 16, contacts 18 and active region 12 are electrically equivalent and have a first DC bias, while gate electrode 14 having a second bias. Capacitances between these conductive features include M1-to-gate-electrode capacitance $C_{m1-po}$, contact-to-gate-electrode capacitance $C_{co-po}$ on both sides of gate electrode 14, and active-to-gate-electrode capacitance $C_{act-po}$ on both sides of gate electrode 14. It is noted, however, that dividing $C_{act-po}$ into a symmetric left and right component, as shown in FIG. 5B, is made for the convenience of the device modeling. However, in practice, it is a single capacitance formed between active region 12 and gate electrode 14 under the current measurement condition. The capacitances measured under the current measurement configuration include the lump sum of $C_{m1-po}$, $C_{co-po}$, and $C_{act-po}$ in DUT unit cell 20. The total capacitance $C_A$ measured on DUT 10A of FIG. 3 between the two probes of LCR meter 50 can be expressed as the following:

$$C_A = N(C_{m1-po} + C_{co-po} + C_{act-po} + C_{extra}) + C_{other} \quad (1)$$

where N represents the total number of DUT unit cells 20 in DUT 10A; $C_{extra}$ includes the capacitance in DUT unit cell 20 other than $C_{m1-po}$, $C_{co-po}$, and $C_{act-po}$, such as parasitic capacitance between contacts 18b (see FIG. 5A) and gate electrode 14; And $C_{other}$ includes, for example, any other capacitance associated with the conductive paths between capacitance meter probe tips and DUT unit cells 20, such as parasitic capacitance on comb structures "$C_L$," "$C_R$", and test pads P1, P2, and P3.

It is herein stressed, although a known passive capacitance measuring approach using an LCR meter is described in the example with respect to FIG. 5B, other suitable capacitance measuring approaches can also be employed to measure the contact and via capacitance of interest without departing from the spirit and scope of the invention. In an additional and/or alternative embodiment, a known active capacitance measuring approach, such as the well-known CBCM (charged-based capacitance measurement) approach is also used for the desired contact capacitance measurement. In other embodiments, known capacitance measurement approaches, such as the above described LCR meter approach, CBCM approach, and other suitable active or passive capacitance measurement approaches are used to measure via capacitance in an IC. In preferred embodiments, there is no preference between the various available capacitance measuring approaches so long as desired measuring accuracy and precision is achieved.

Afterwards, the measurement just described is repeated on a reference contact-to-gate-electrode capacitance test structure (DUT) formed, for example, on a same test line. The reference DUT is substantially similar to target DUT 10A illustrated above with respect to FIG. 3, except that the contact configuration in DUT unit cells of a reference DUT does not include the contacts to be modeled.

FIG. 6A is a layout view illustrating DUT unit cell 21 of a reference contact-to-gate-electrode capacitance test structure mentioned above. To clarify description and avoid repetition, numerals and letters used in FIG. 5A are used again for the various elements in FIG. 6A. Like FIG. 5A, M1 layers overlying gate electrode 14 and active region 12 are not shown for clearer view. Also, reference numbers described in FIG. 5A are not described again in detail herein. It is shown in FIG. 6A that DUT unit cell 21 is identical to DUT unit cell 20 in FIG. 5A, except that contacts 18c in DUT unit cell 20 of target DUT 10A no longer exist in DUT unit cell 21 of a reference DUT.

Figure 6B:
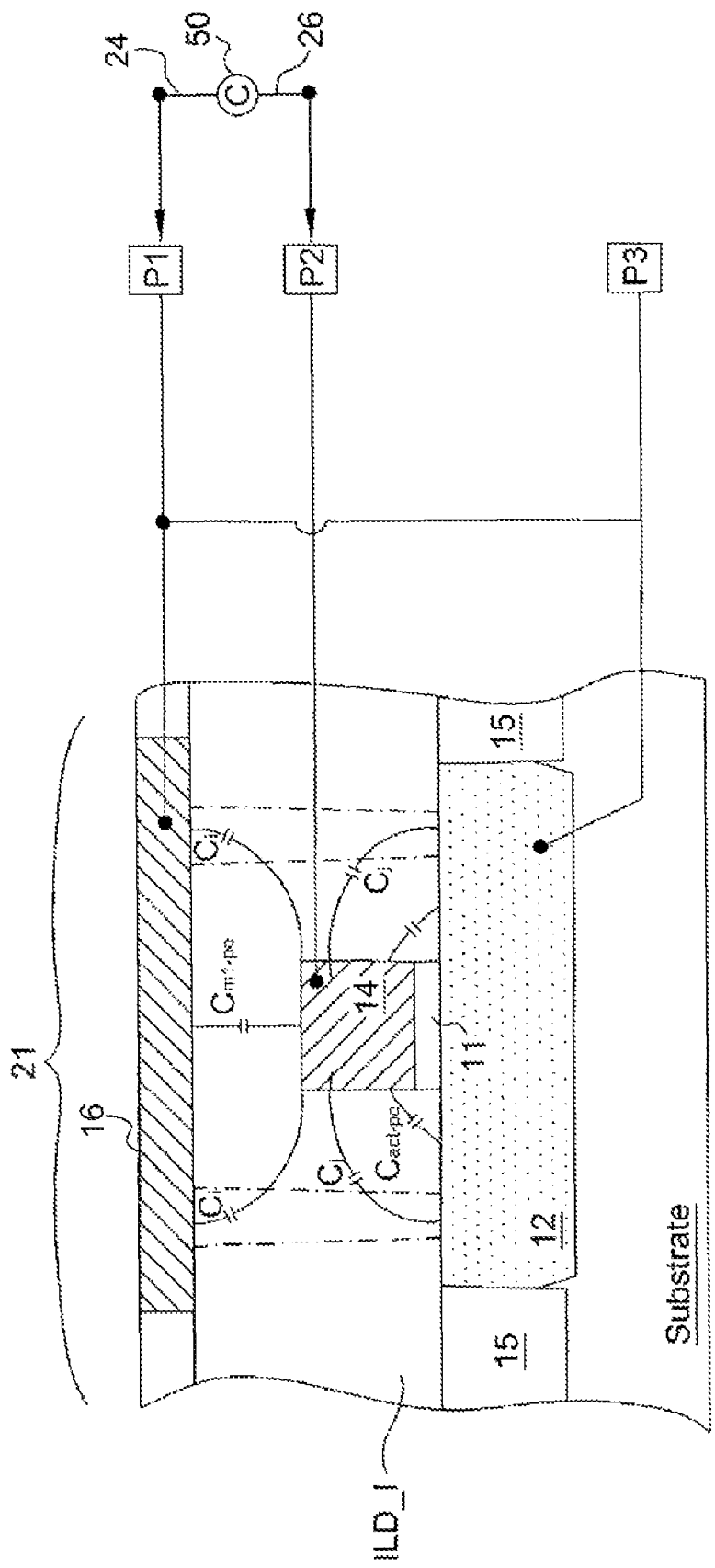
FIG. 6B is a schematic cross-sectional view of the DUT unit cell in FIG. 6A in the area noted as D-D'.

FIG. 6B is a schematic cross-sectional view of DUT unit cell 21 in FIG. 6A. The cross-sectional view of FIG. 6B is made at the same area D-D' as that made at DUT unit cell 20 in FIG. 5A. To clarify description and avoid repetition, the reference numbers, numerals, letters, and measurement setup described with respect to FIG. 5B are re-used in FIG. 6B. The areas taken by contacts 18c of DUT unit cell 20 in FIG. 5B are drawn in ghost lines in FIG. 6B for comparison purposes. These areas are filled with ILD_I in DUT unit cell 21.

When the same measurement described with respect to target DUT 10A in FIG. 3 is repeated on the reference DUT described with respect to FIG. 6B, the total capacitance $C_B$ measured on reference DUT between the two probes of capacitance meter 50 can be expressed as the following:

$$C_B = N(C_{m1-po} + C_{act-po} + C_{extra}) + C_{other} \quad (2)$$

Subsequently, the to-be-measured $C_{co-po}$ can be derived from $C_A$ and $C_B$ as the following:

$$C_{co-po} = (C_A - C_B)/N \quad (3)$$

In preferred embodiments, $C_{co-po}$ is typically expressed in a capacitance-per-length format. In one preferred embodiment, $C_{co\_po}$ obtained through above measurement steps has a value of about 2.96E-2 (fF/μm). In another preferred embodiment, $C_{co\_po}$ obtained on similar target and reference DUTs has a value of about 3.06E-2 (fF/μm). This provides a highly accurate measurement of $C_{co-po}$, because the unwanted capacitances are excluded from the measurement result through the two-steps measurement procedure as described above.

It is worthy noting, however, that, in practice, M1-to-gate-electrode capacitance in DUT unit cell 21 in a reference DUT is typically not identical to that of DUT unit cell 20 in a target DUT under a same measurement condition. Thus, the validity of deriving $C_{co-po}$ from $C_A$ and $C_B$ should be analyzed and verified. As shown in FIG. 6B, M1-to-gate-electrode capacitance in DUT unit cell 21 is slightly larger than $C_{m1-po}$ by an additional value of $C_t$, due to the regained spaces in ILD_I, which are otherwise occupied by contacts 18c in a target DUT. Similarly, active-to-gate-electrode capacitance in DUT unit cell 21 is slightly larger than $C_{act-po}$ by an additional value of $C_j$, as shown. But, as those skilled in the art will recognize, $C_i$ and $C_j$, associated with a single contact, are negligibly small by nature because the space gained from a to-be-modeled contact, which typically has a minimum design rule contact size, is extremely small in advanced technology.

In preferred embodiments, additional caution has also been taken to reduce the accumulative effects of Ci and Cj. As an example, when constructing contact test structures, the total numbers of to-be-measured contacts in a target DUT are limited so that the accumulation of $C_i$ and $C_j$ will not cause significant discrepancy between M1-to-gate-electrode capacitances in a target and reference DUT. In a preferred embodiment, a target DUT for contact-to-gate-electrode capacitance measurement has a unit cell array of 100 by 100, each DUT unit cell having ten contacts to be modeled and measured. Additionally, in order to obtain a good statistical result of $C_{co-po}$ measurement, same measurement is repeated on a number of target DUTs that have the same configurations but different numbers of contacts-to-be-measured in their DUT unit cells. For example, in the aforementioned embodiment, the same measurement is repeated on a second target DUT that has a 100 by 100 unit cell array, but only five to-be-measured contacts in each unit cell. This practice is routinely used in preferred embodiments and is generally referred to as DUT split.

The contact-to-gate-electrode capacitance measurement results may then be used to create more accurate contact models that may be used by Electronic Design Automation (EDA) tools. The contact models thus created have a capacitance that matches with the contact capacitance in an actual IC. This may, in turn, lead to more accurate IC simulation results. The method of creating contact models using the measurement results from preferred embodiments of the current invention can be found in commonly assigned and co-pending U.S. patent application Ser. No. 11/865, 304 filed on Oct. 1, 2007, and entitled "Accurate Parasitic Capacitance Extraction for Ultra Large Scale Integrated Circuits," which application is incorporated herein by reference.

The second aspect of this invention relates to via capacitance test structures and methods of conducting accurate via capacitance measurement in an IC. The inventive features of via test structures and methods of conducting via capacitance measurement are similar to those described above in regard to contact test structures and methods of measuring contact capacitance. Through studying and comparing via capacitance measurement results on target DUTs and a reference DUT, accurate via capacitance may be obtained by eliminating the not-to-be-measured capacitances in the measurement results. The details of the preferred embodiments will be described as the following.

FIG. 7A is a schematic layout view illustrating the configuration of target DUT 10B, used for via capacitance measurement in one preferred embodiment of the present invention. Target DUT 10B comprises a first conductive comb structure C1, having downward fingers and a second complementary conductive comb structure C2, having upward fingers. C1 and C2 are electrically isolated from each other and are preferably made in a first interconnect layer, such as M1. Target DUT 10B also comprises a third conductive comb structure C3, having rightward fingers and a fourth complementary conductive comb structure C4, having leftward fingers. C3 and C4 are electrically isolated from each other and are formed in an upper interconnect layer, such as M2. M1 and M2 are electrically insulated from each other by a first inter-metal dielectric layer (not shown), such as silicon dioxide, as is well known in the art. Moreover, C1 is electrically coupled with C4 through to-be-measured-and-modeled vias 40a (empty circles) formed at C1-C4 cross-over regions and at the end of the "handles" of combs C1 and C4. In FIG. 7A, the end spot of the "handles" of C1 and C4 is highlighted with an "A" within a dashed circle for clearer view. It should be noted that the dashed circles around points "A" and "B" are not a structural element, but are used only to visually highlight the locations of points "A" and "B." In a similar manner, C2 is electrically coupled with C3 through vias 40b (solid circles) at C2-C3 cross-over regions and at the end spot "B" of the handles of combs C2 and C3. Vias 40b are typically substantially similar to vias 40a. Contacts 40a and 40b are preferably formed by common processing steps. Nodes "A" and "B" may be, in turn, connected to probe pads (not shown) on a testline, where test stimuli may be applied. It is worthy noting that, under the current DUT configuration, vias 40a are electrically connected to node "A," and vias 40b are electrically connected to node "B." In a preferred embodiment, vias 40a and 40b on target DUT 10B have a maximum design rule density.

Remaining in FIG. 7A, when conducting via capacitance measurements on target DUT 10B, a known LCR meter 50 is connected between node "A" and node "B" through corresponding probe pads on a test line (not shown). In one preferred embodiment, drive end 24 of LCR meter 50 is coupled to node "A" and sense end 26 of LCR meter 50 is coupled to node "B." As a result, vias 40a are connected to a first DC bias V1 and vias 40b are connected to a second DC bias V2.

Figure 7B:
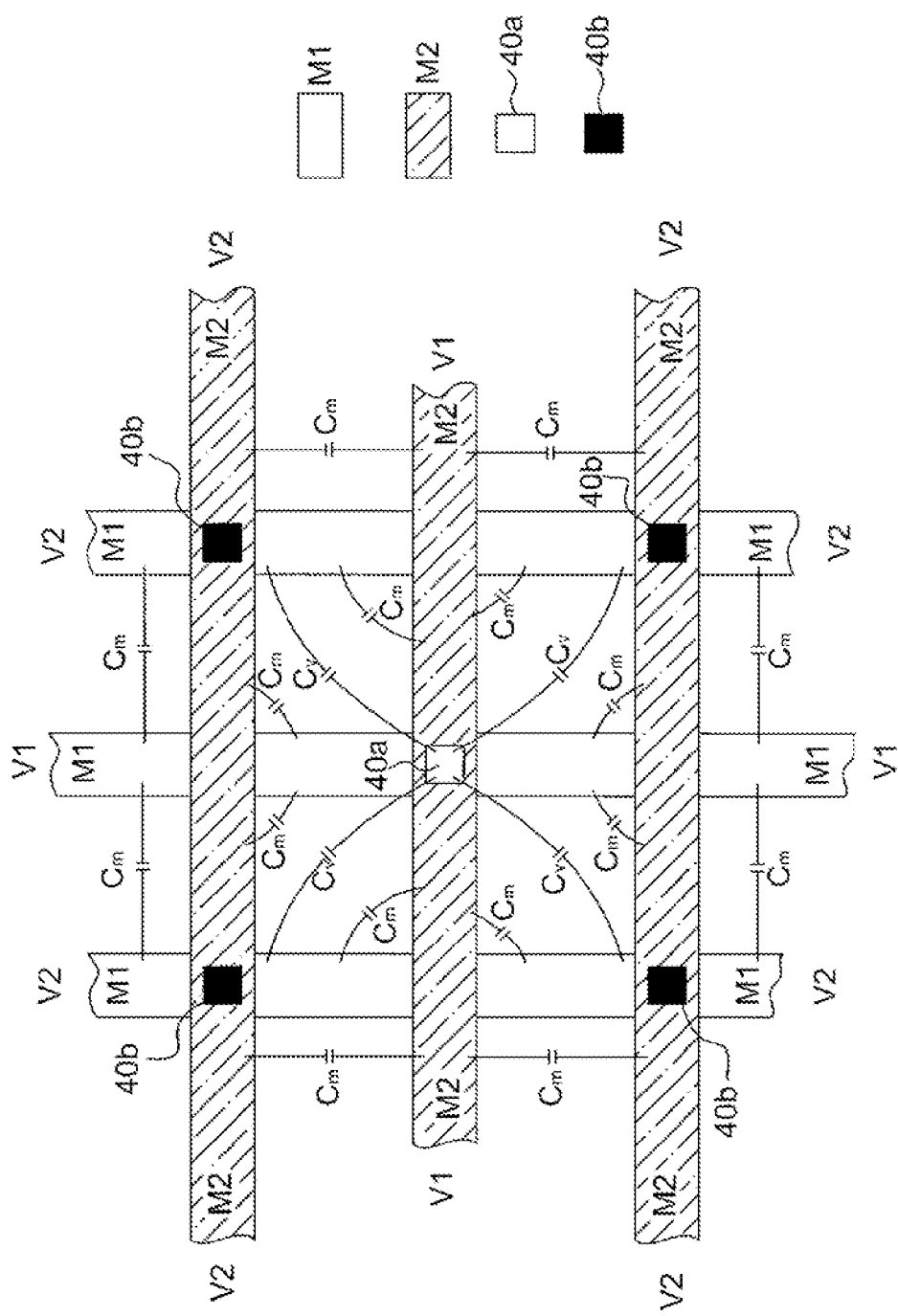
FIG. 7B is an expanded view of the target DUT in FIG. 7A, illustrating capacitances formed around one of to-be-measured via under a preferred measurement condition.

FIG. 7B is an expanded view of target DUT 10B in FIG. 7A, illustrating capacitances formed around one of vias 40a under the current DC bias condition. It is shown that the capacitances include via capacitances $C_v$ between via 40a and surrounding conductive features connected to ground, and Metal-to-Metal capacitances $C_m$. It is noted that $C_v$ typically includes via-to-via, via-to-M1, and via-to-M2 capacitance. In the current embodiment, these components are not separately measured and modeled, and thus, are not separately shown in FIG. 7B in order to simplify illustration. For clearer description, a combined $C_V$ and $C_M$ will be used herein to represent the overall via capacitance and Metal-to-Metal capacitance measured on target DUT 10B under a preferred measurement condition.

The total capacitance $C_T$ measured from DUT 10B of FIG. 7A between the drive end 24 and sense end 26 of LCR meter 50 can be expressed as the following:

$$C_T = C_V + C_M + C_{other} \quad (4)$$

where $C_{other}$ represents capacitances on DUT 10B, other than $C_V$ and $C_M$, under a preferred measurement condition.

Subsequently, the above measurement is repeated on a reference via capacitance DUT. The reference DUT for via capacitance measurement is substantially similar to target via DUT 10B illustrated above with respect to FIG. 7A, except that the vias 40a and 40b in the cross-over regions are removed, only leaving the ones at spots "A" and "B." A reference via test structure $10B_{ref}$ in correspondence with target via DUT 10B of FIG. 7A is shown in FIG. 7C.

Figure 7C:
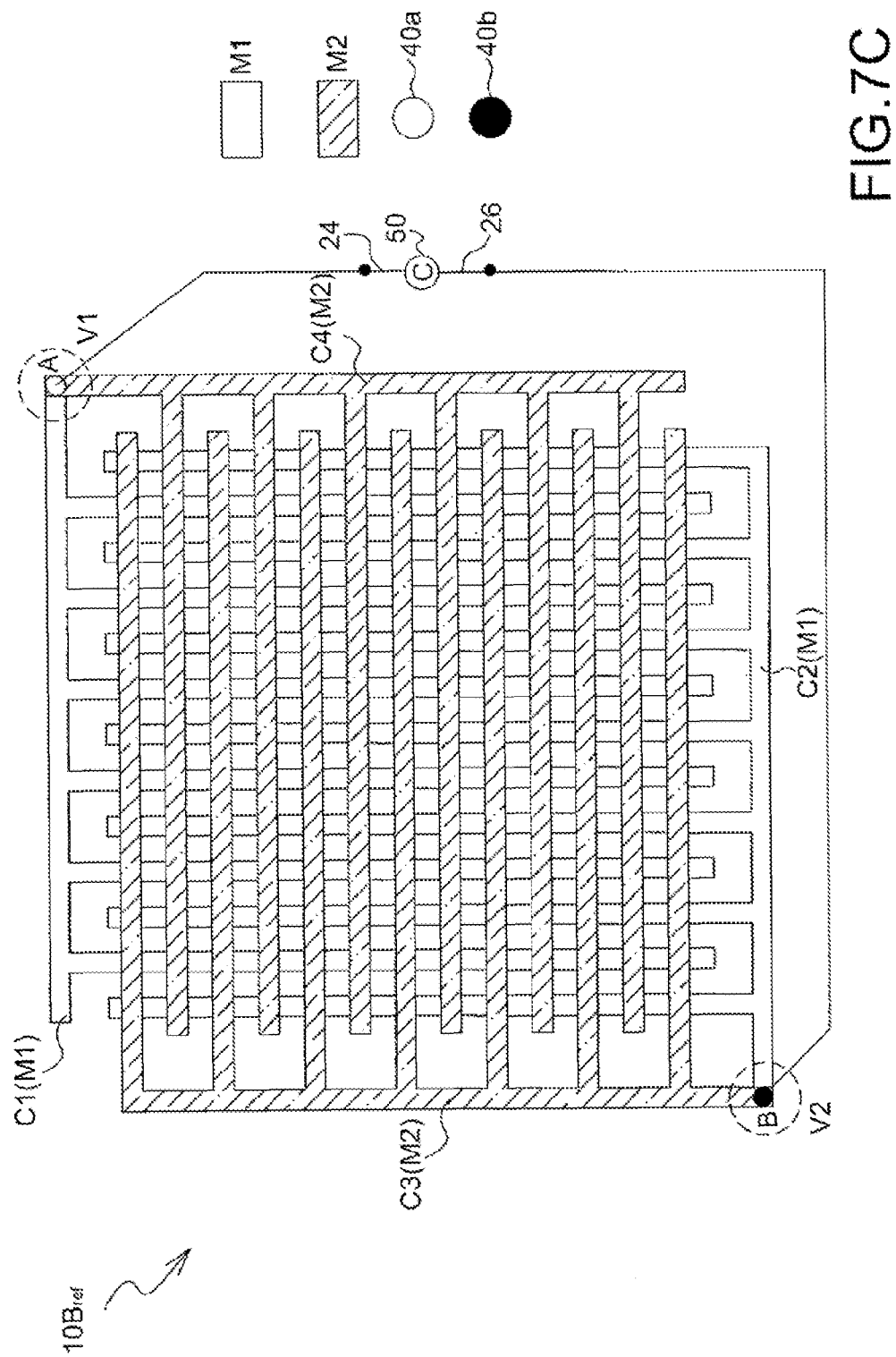
FIG. 7C shows a reference via DUT in correspondence with the target via DUT of FIG. 7A.
Figure 7D:
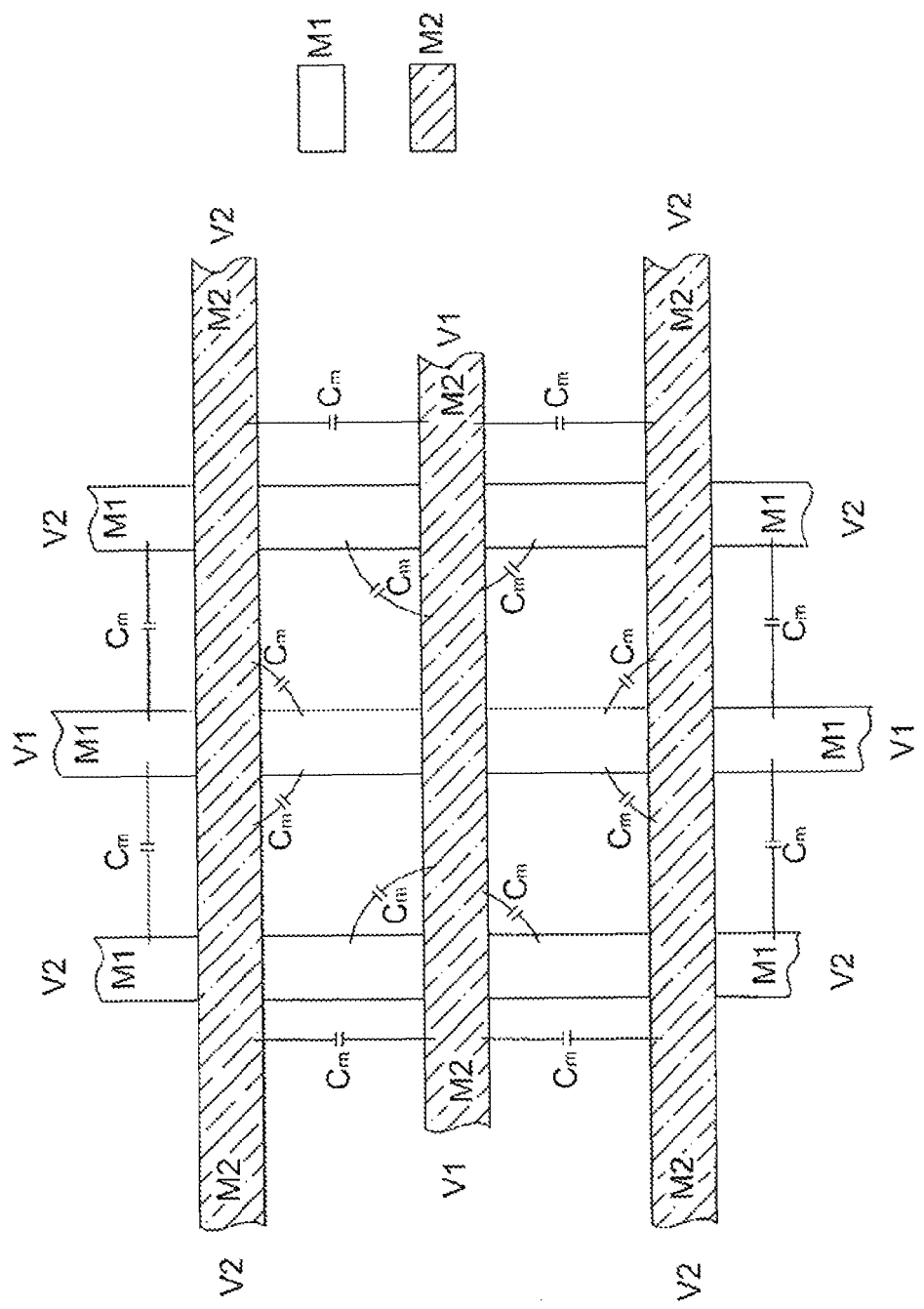
FIG. 7D is an expanded view of the reference DUT in FIG. 7C, illustrating capacitances formed in a reference DUT under the same measurement condition as that of a target DUT.

FIG. 7D is an expanded view of reference DUT $10B_{ref}$ in FIG. 7C, illustrating capacitances formed in DUT $10B_{ref}$ under the same measurement condition as that of target DUT 10B in FIG. 7A. It is shown that via capacitances no longer exist, only leaving the Metal-to-Metal capacitances $C_m$. The total capacitance $C_{T\_ref}$ measured from DUT $10B_{ref}$ of FIG. 7C between node "A" and "B" can be expressed as the following:

$$C_{T\_ref} = C_M + C_{other} \quad (5)$$

the to-be-measured via capacitance $C_v$ can be derived from $C_T$ and $C_{T\_ref}$ as the following:

$$C_v = (C_T - C_{T\_ref})/N \quad (6)$$

where N represents the total number of to-be-measured vias in a target via DUT, such as 40a of DUT 10B in FIG. 7A. $C_v$ is typically expressed in a capacitance-per-length format.

Figure 7E:
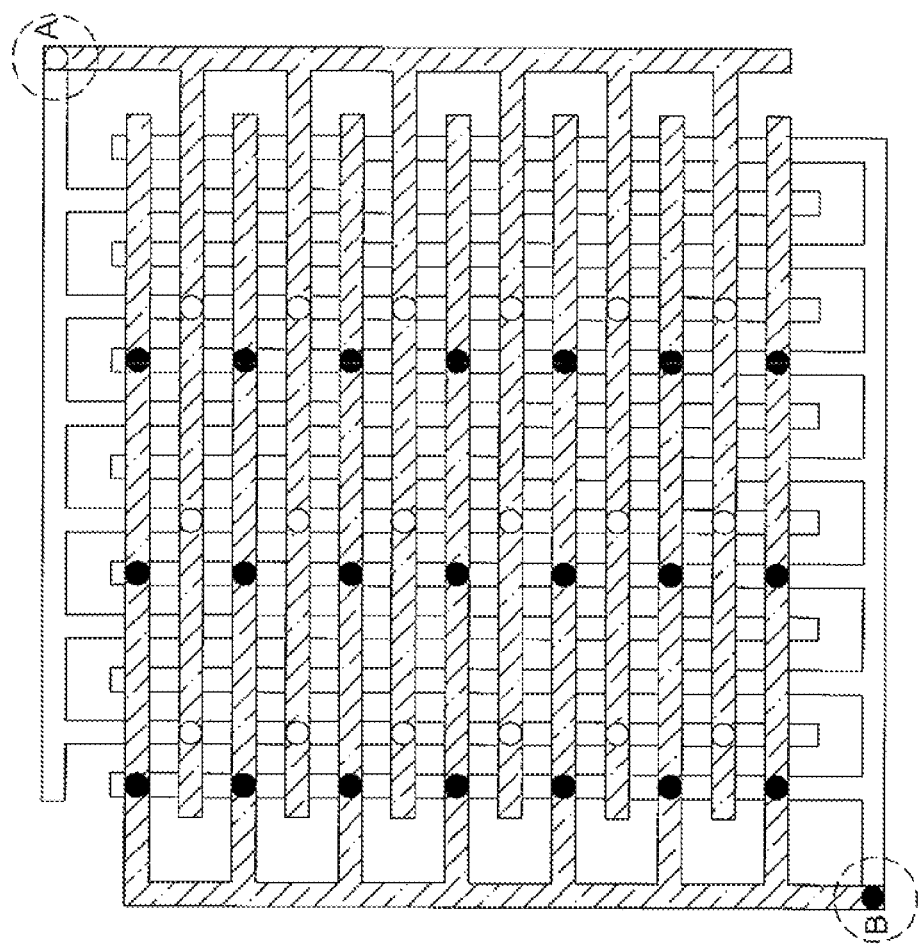
FIG. 7E shows an alternative target via DUT in correspondence with the DUT in FIG. 7A, having a reduced via density.

In preferred embodiments, the practice of DUT split, used in obtaining accurate contact-to-gate-electrode capacitance as described earlier, is also conducted in measuring via capacitance. As an example, FIG. 7E shows a via target DUT 10B1 having a reduced via density, when compared with its counterpart DUT 10B illustrated in FIG. 7A. Similarly, the numbers of to-be-measured vias in a target DUT is limited for the same rationale explained earlier as with contact capacitance DUT. In the current embodiment, target via DUT 10B of FIG. 7A has about 226,000 vias, and target via DUT 10B1 of FIG. 7E has about 9,000 vias. Through via capacitance measurement in preferred embodiments, it is revealed that via capacitance can account for about 15% of the overall interconnect-related capacitance in an IC product made by advanced technology. This further justifies the criticality of creating accurate via models in order to obtain accurate simulation results in ICs made by advanced technology.

Figure 8:
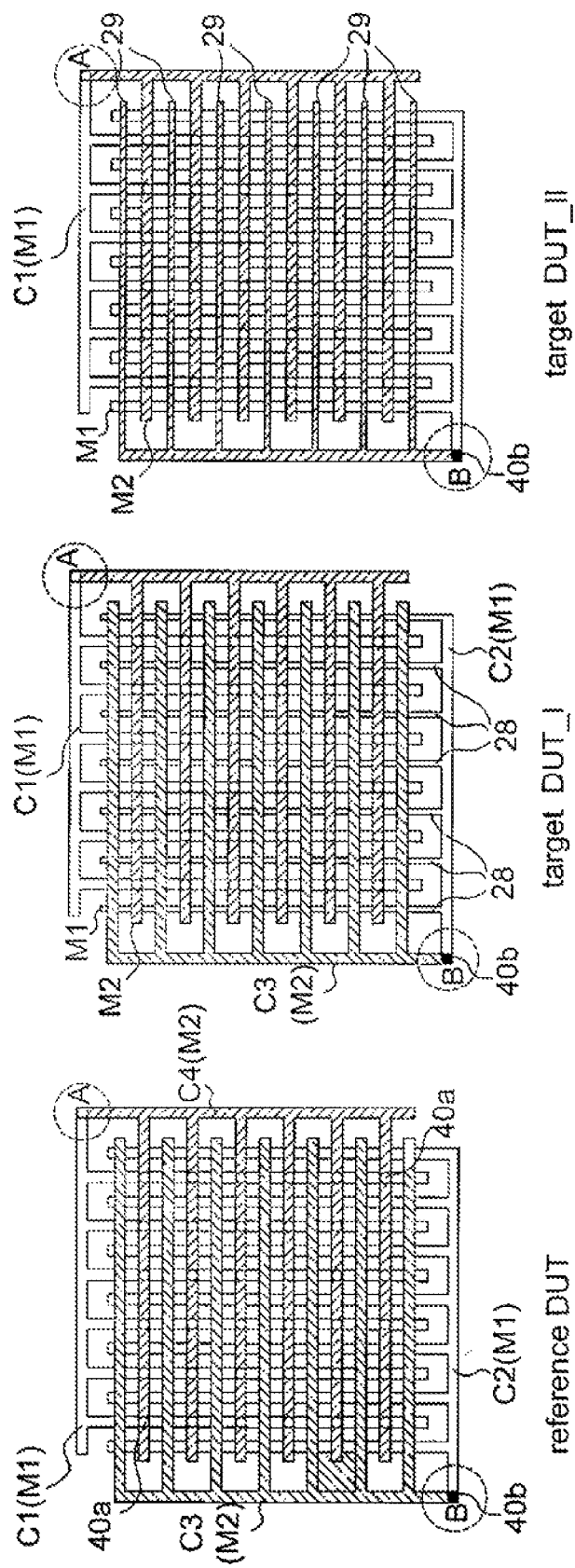
FIG. 8 illustrates a reference DUT and two target DUTs used to measure and model via-to-metal capacitance in a preferred embodiment.

FIG. 8 illustrates another preferred embodiment of the current invention, where similar test structures and measurement steps described above are used to study the effect on via capacitance due to the feature size variation of conducting layers surrounding a via. The structure of the reference DUT is substantially similar to that used for via capacitance measurement as described with respect to FIG. 7C, except that vias 40a are presented at the cross-over regions of comb structures C1 and C2. When the same measurement condition described above is applied to the reference DUT of the current embodiment, the total capacitance measured between node "A" and "B" can be expressed as the following:

$$C_{ref} = C_{via\_ref} + C_M + C_{other} \quad (7)$$

where $C_{via\_ref}$ is the total via capacitance in the reference DUT, formed between 40a and adjacent M1 and M2 fingers connected to ground; $C_M$ is the total Metal-to-Metal capacitance formed in the reference DUT between metal layers connected to the drive end 24 having first bias V1 and the sense end 26 having a second bias V2 (see FIG. 7C); And $C_{other}$ represents capacitances associated with the reference DUT, other than $C_{via}$ and $C_{M\_ref}$, such as the capacitance on test pads and capacitance meter probe tips, as described earlier.

FIG. 8 also shows a first and a second target test structures DUT_I and DUT_II. DUT_I differs from the reference DUT in that fingers 28 of conductive comb structure C2 in the first interconnect layer (e.g., M1) are significantly thinner than those of the reference DUT. DUT_II differs from the reference DUT in that fingers 29 of conductive comb structure C3 in the second interconnect layer (e.g., M2) are significantly thinner than those of the reference DUT. As can be appreciated, when the same measurement condition is applied on DUT_I, the total capacitance $C_{DUT\_I}$ measured between node "A" and "B" can be expressed as the following:

$$C_{DUT\_I} = C_{via\_DUT\_I} + C_M + C_{other} \quad (8)$$

where $C_{via\_DUT\_I}$ is the total via capacitance in the target DUT_I. Because the width of M1 fingers 28 of conductive comb C2 is significantly reduced, $C_{via\_DUT\_I}$ is expected to be significantly smaller than $C_{ref}$ due to reduced via-to-M1 capacitance. Meanwhile, the smaller width of M1 fingers 28 of C2 will have less impact on the total Metal-to-Metal capacitance because the spacing and area between M1 fingers 28 of C2 and M1 fingers of C1 remains unchanged, while capacitance change between M1 fingers 28 of C2 and upper layer M2 fingers is negligibly small, as can be appreciated by those skilled in the art. By comparing $C_{ref}$ and $C_{DUT\_I}$, it is possible to create a via model having an improved accuracy of via-to-Metal capacitance.

Similarly, the total capacitance $C_{DUT\_II}$ measured between node "A" and "B" on target DUT_II can be expressed as the following:

$$C_{DUT\_II} = C_{via\_DUT\_II} + C_M + C_{other} \quad (9)$$

because the width of M2 fingers 29 of conductive comb C3 is significantly reduced, $C_{via\_DUT\_II}$ is expected to be significantly smaller than $C_{ref}$ due to reduced via-to-M2 capacitance, while the changes on the total Metal-to-Metal capacitance is negligibly small, due to similar reasons explained above. Thus, it is possible to create a via model having an improved accuracy of via-to-M2 capacitance.

In a further embodiment of the current invention, the preferred contact and via capacitance test structures and methods of conducting contact and via capacitance measurement described above are used in measuring and modeling contact capacitance in IC products made of semiconductor devices having a three-dimensional (3-D) configuration, such as a FinFET.

Figure 9:
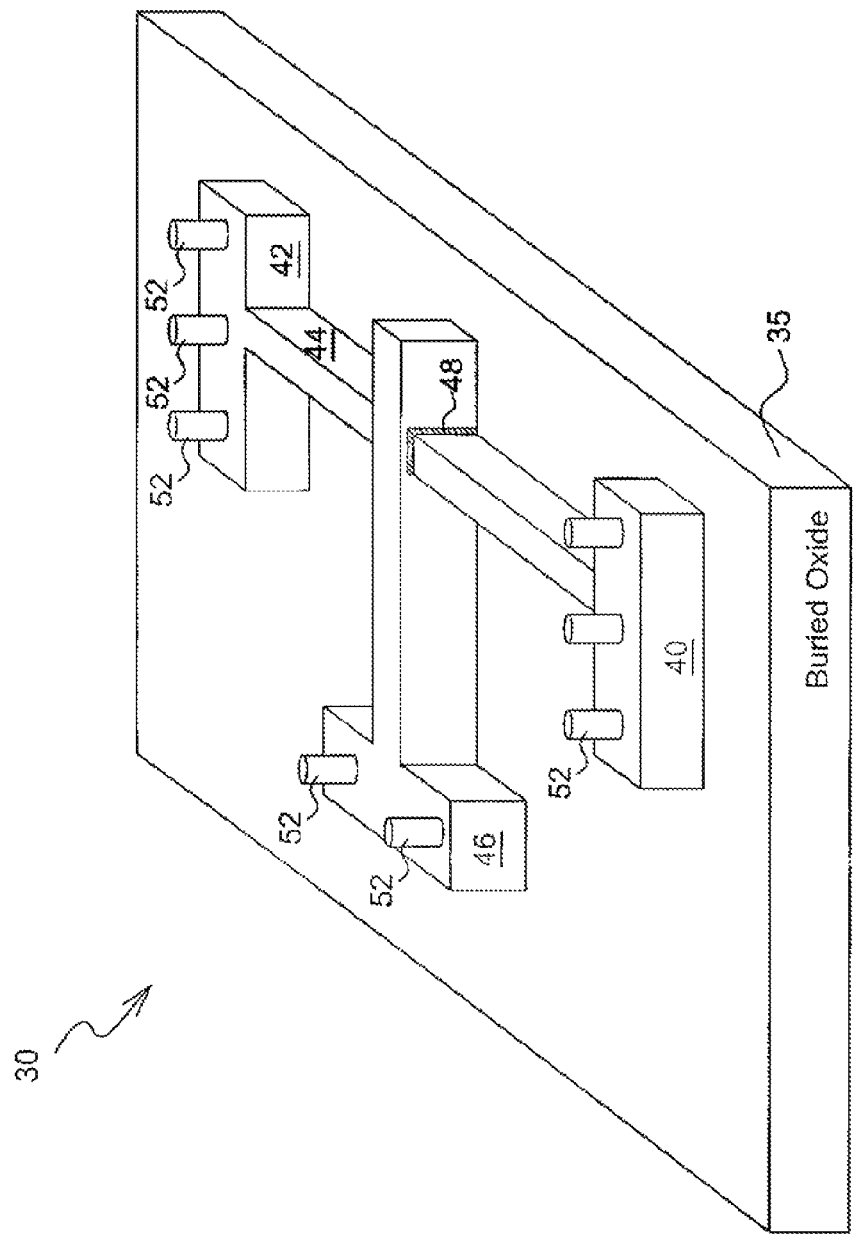
FIG. 9 shows a perspective view of a prior art FinFET MOS transistor.

FIG. 9 shows a perspective view of a prior art FinFET MOS transistor 30. As is known in the art, FinFET MOS device 30 has a 3-D configuration when compared with the conventional planar MOS device configuration. FinFET structures are known as promising candidates for MOS devices in advanced technology because their configuration is known to suppress short channel effects and maintain desired drive current when the device dimension scales down to the nanometer range. In FIG. 9, FinFET MOS transistor 30, fabricated on an insulating substrate 35, includes silicon source island 40 and drain island 42 connected by a silicon fin (channel) 44. Gate region 46 extends across channel fin 44 and is isolated from channel fin 44 by gate oxide 48. Channel fin 44 extends horizontally on substrate 35 with gate 46 in planes on either side of channel fin 44. Contacts 52 are formed between source/drain islands 40, 42, gate region 46, and the first interconnect layer (not shown).

Figure 10A:
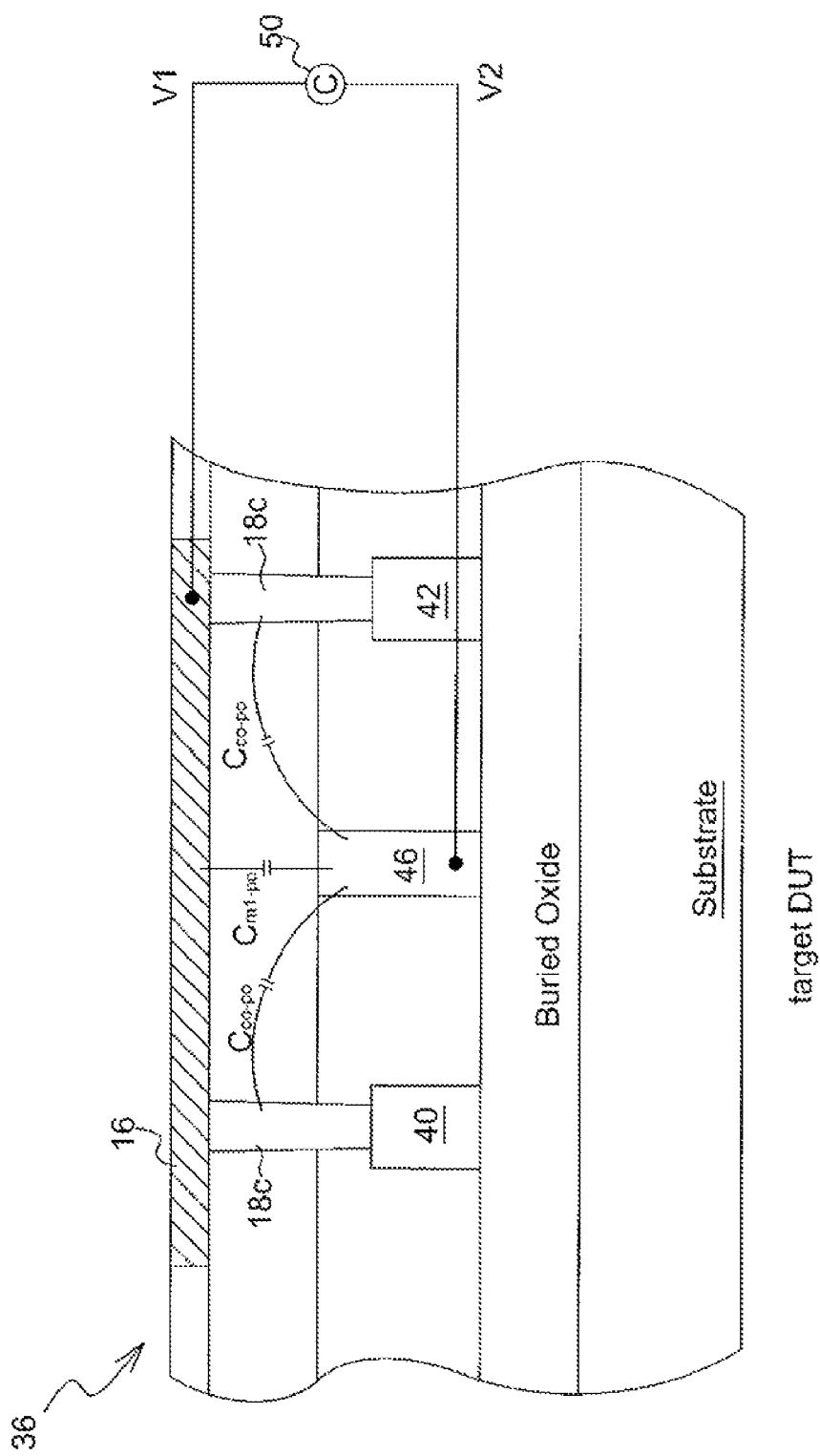
FIGS. 10A and 10B illustrate schematic cross-sectional views of a unit cell of a target DUT and a unit cell of a reference DUT used to measure and model the contact capacitance in an IC comprising FinFET MOS devices in a preferred embodiment.
Figure 10B:
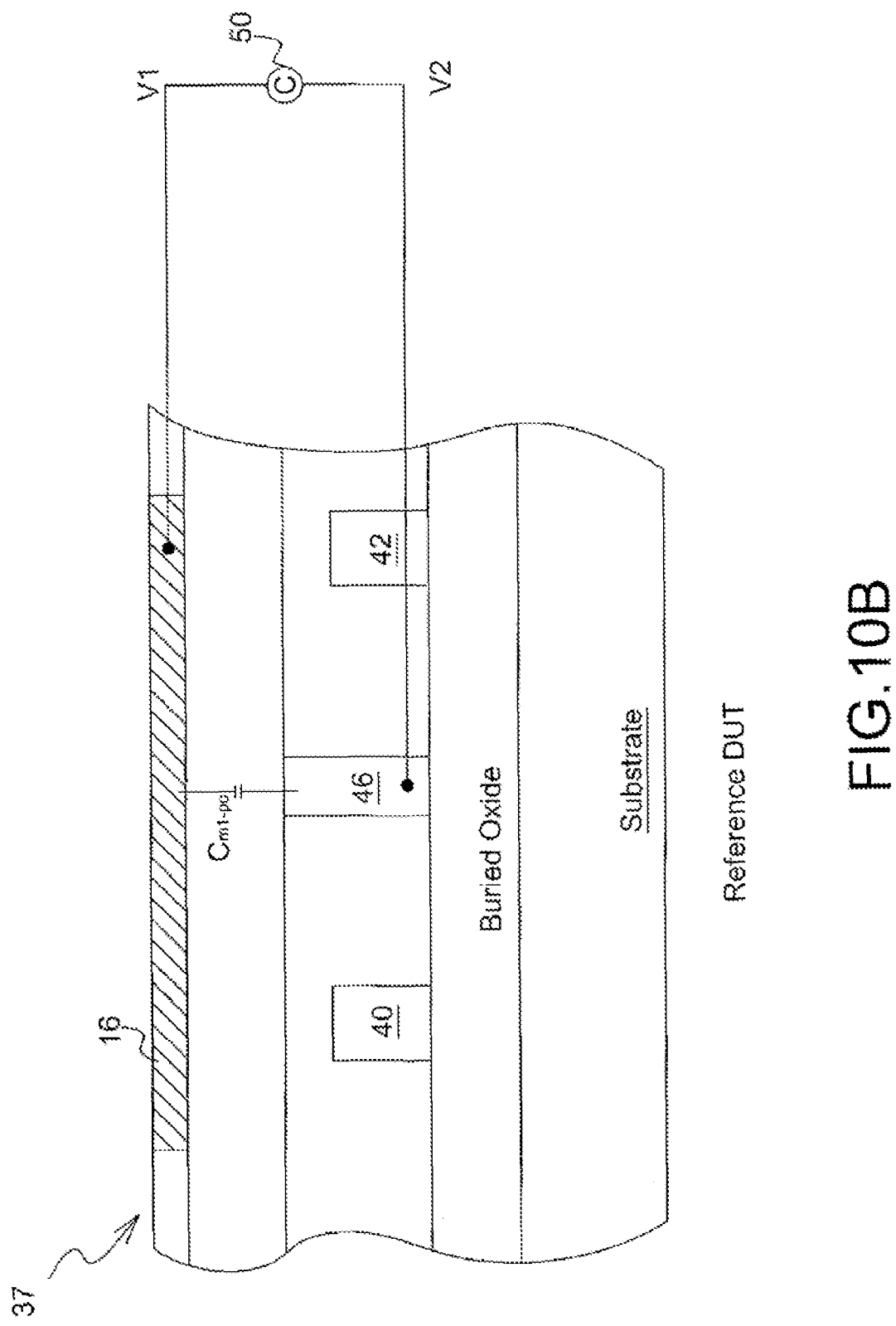

FIGS. 10A and 10B illustrate schematic cross-sectional views of DUT unit cell 36 of a target DUT (not shown) and DUT unit cell 37 of a corresponding reference DUT (not shown) constructed in a preferred embodiment to measure and model the contact capacitance in an IC comprising FinFET MOS devices. The configurations of the DUTs and methods of conducting the desired capacitance measurements thereon are similar to those described previously with respect to DUTs used in measuring and modeling the contact-to-gate-electrode capacitance in ICs made of planar MOS devices, except that DUTs in the current embodiment are formed by processing steps used in forming ICs comprising FinFET devices. It is shown in FIG. 10A that contacts 18c are formed to couple source/drain islands 40, 42 with conductive layer 16, preferably in the first interconnect layer M1. Conductive layer 16 and gate electrode 46 of each DUT unit cell 36 are, in turn, connected to a first and a second probe pads on a testline (not shown). When conducting desired capacitance measurements, a known LCR meter 50 is coupled between the first and second probe pads. The first probe pad is biased to a first DC voltage V1 and the second probe is biased to a second DC voltage V2. LCR meter 50 reads the total capacitance, including to-be-measured contact-to-gate-electrode capacitance $C_{co\_po}$, on the target DUT.

The measurement is repeated on a reference DUT, which is substantially similar to the target DUT, except to-be-measured contacts 18c are removed from the reference DUT unit cells. The method of making measurements on a reference DUT, and the procedure of deriving $C_{co\_po}$ from the measurement results on the target and reference DUTs are similar to those described previously in regard to ICs made of planar devices. Furthermore, the measures taken to reduce measurement errors, such as the DUT split described earlier, are also used in the current embodiment, and will not be described again.

In an additional embodiment of the current invention, via capacitance test structures and methods of measuring the same are developed to measure and model through-silicon-via (TSV) capacitance in an IC product that encapsulates multiple integrated circuit dies configured in a stacked manner.

Figure 11:
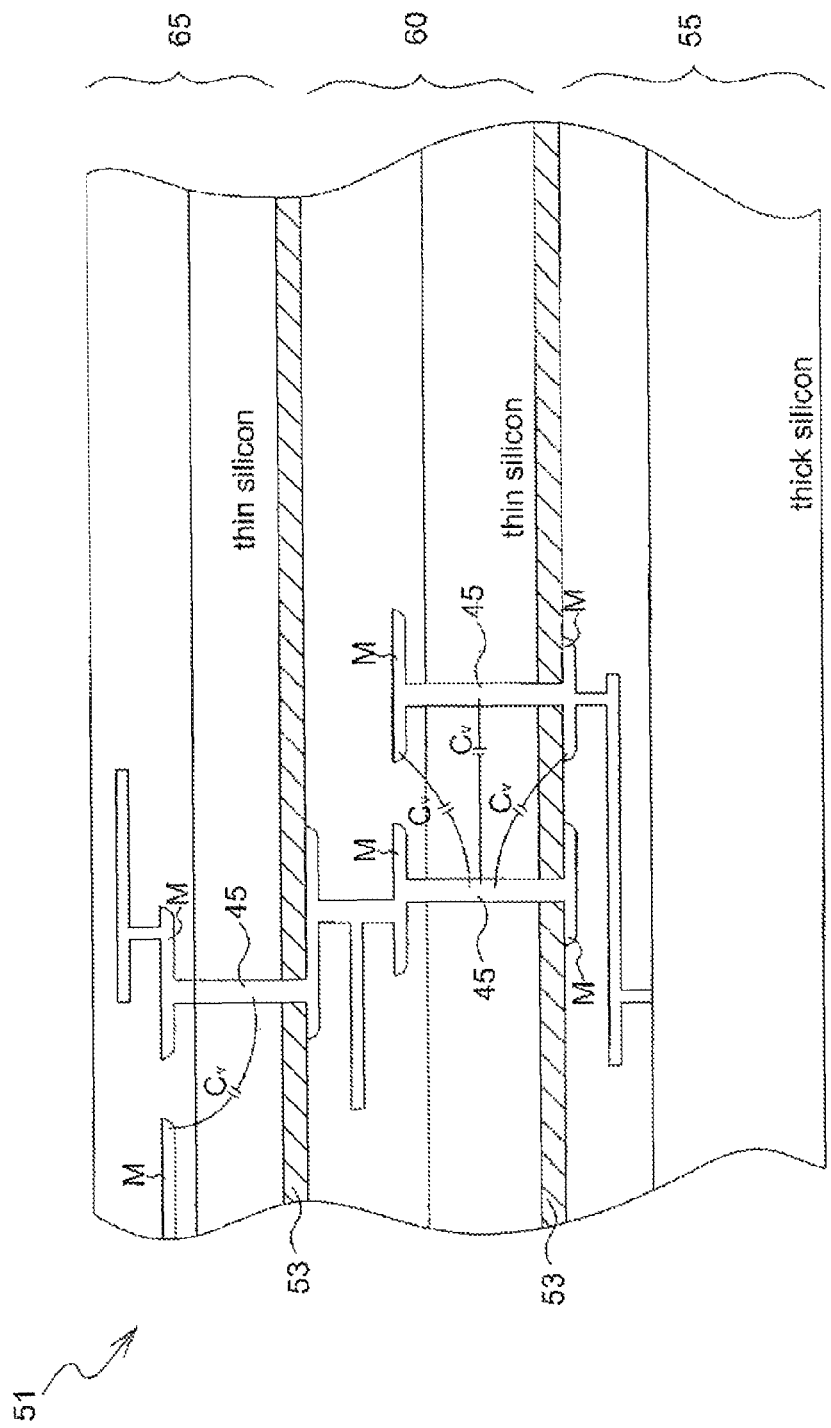
FIG. 11 shows a portion of a cross-sectional view of a prior art IC that includes multiple integrated circuit dies packaged in a stacked manner.

FIG. 11 shows a portion of a cross-sectional view of a typical IC product 51, which includes multiple integrated circuit dies packaged in a stacked manner. This stacked package scheme is known to provide a space-saving solution for forming a complex electronic system in a single package through stacking multiple integrated circuit dies. IC product 51 includes a first die 55, a second die 60, and a third die 65, one stacking on the top of the other, as shown. In a preferred embodiment, dies 60 and 65 are bulky, silicon-based integrated circuits having a thin silicon substrate of about 100 µm, for example. Die 55 is a bulky, silicon-based integrated circuit, but has a thick silicon substrate of about 1000 µm, which provides mechanical support for dies 60 and 65. In other preferred embodiments, dies 55, 60, and 65 may include integrated circuits having other substrate materials and configurations, such as silicon germanium, gallium arsenide, compound semiconductor, multi-layers semiconductor, silicon-on-insulator (SOI), and any combination.

Remaining in FIG. 11, dies 55, 60, and 65 are electrically insulated from each other through dielectric glue layers 53. Moreover, TSVs 45 are formed in the silicon substrates of dies 60 and 65, through known processing techniques, to provide electrical connections between interconnect layers M in an underlying die to interconnect layers M in an overlying die, as shown. As a common feature, TSVs 45 are typical larger than a conventional via and, in general, have higher aspect ratio (depth-to-width ratio). As can be appreciated, when circuit density in an IC continues to increase in advanced technology, parasitic capacitance $C_v$ between adjacent TSVs 45, and between TSVs 45 and surrounding metal layers M having different electrical potential may become significantly large. Thus, in order to predict the circuit performance of IC product 51, accurate measuring and modeling of the parasitic capacitance associated with TSVs have become increasingly important.

The TSV test structures and methods of measuring the same in the current embodiment are similar to those described above with respect to FIGS. 7A-7E, where the to-be-measured vias are conventional ones formed in a dielectric layer, such as a silicon dioxide layer, connecting lower and upper interconnect layers over a die area of an IC. In contrast, TSV test structures of the current embodiment are formed by processing steps similar to those used in forming ICs having multiple dies in a stacked manner.

Figure 12A:
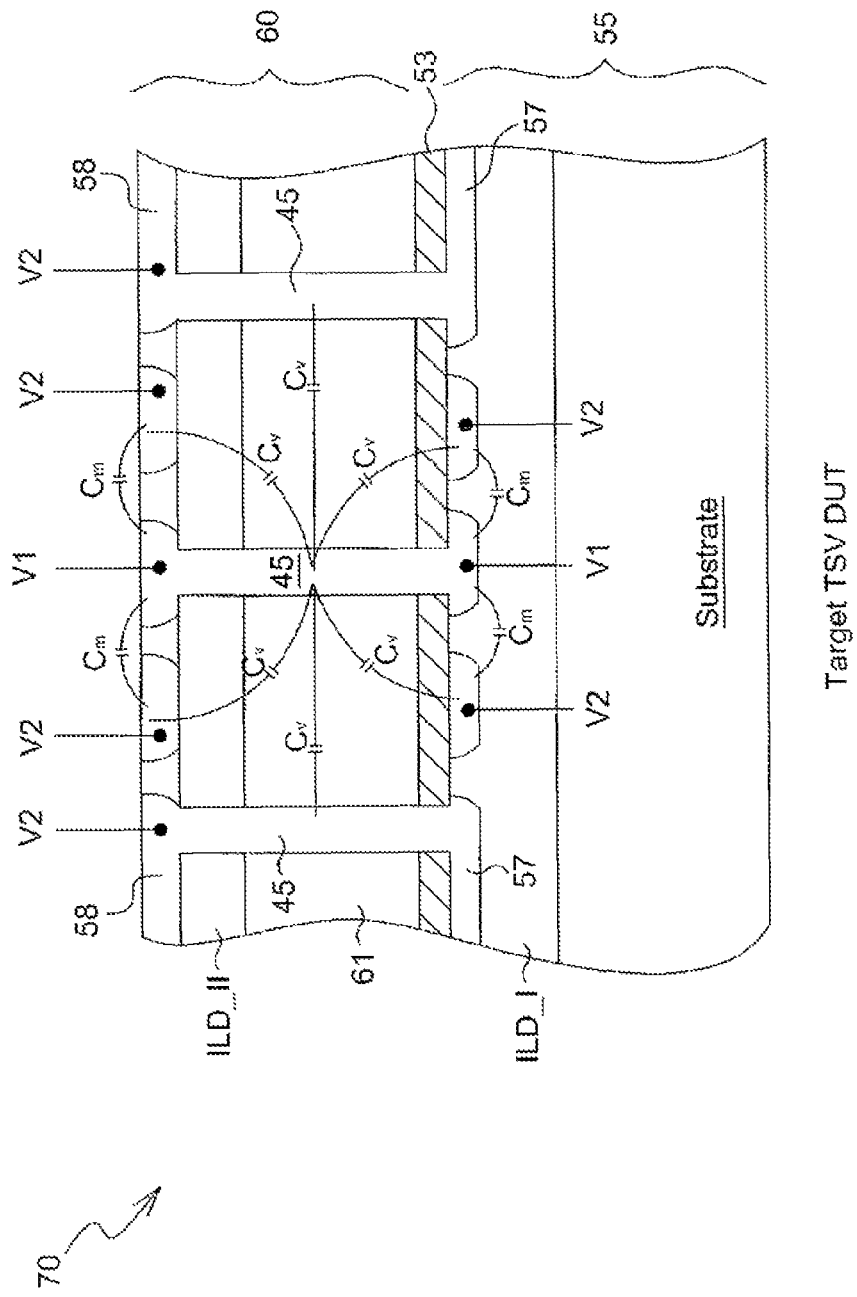
FIGS. 12A and 12B illustrate schematic cross-sectional views of a target DUT and a reference DUT used to measure and model TSV capacitance in an IC.

FIG. 12A illustrates a portion of a schematic cross-sectional view of a target TSV DUT 70 in a preferred embodiment. Target TSV DUT 70 includes metal wires 57 formed in dielectric layer ILD_I of first die 55. Target TSV DUT 70 also includes metal wires 58 formed in dielectric layer ILD_II of second die 60. Die 60 stacks atop die 55, and is bonded to die 55 through thin dielectric glue layer 53. TSVs 45 pass through dielectric glue layer 53, silicon substrate 61 and ILD_II of second die 60, connecting metal wires 57 of die 55 to metal wires 58 of die 60. DC biases similar to those described previously are applied to to-be-measured TSVs 45 and surrounding metal wires 57 and 58. Parasitic capacitances, such as via capacitance $C_v$ and metal-to-metal capacitance $C_m$, formed under the preferred measurement condition are shown in FIG. 12A. The total capacitance on target TSV DUT 70 can be measured through similar measurement setup described earlier.

Figure 12B:
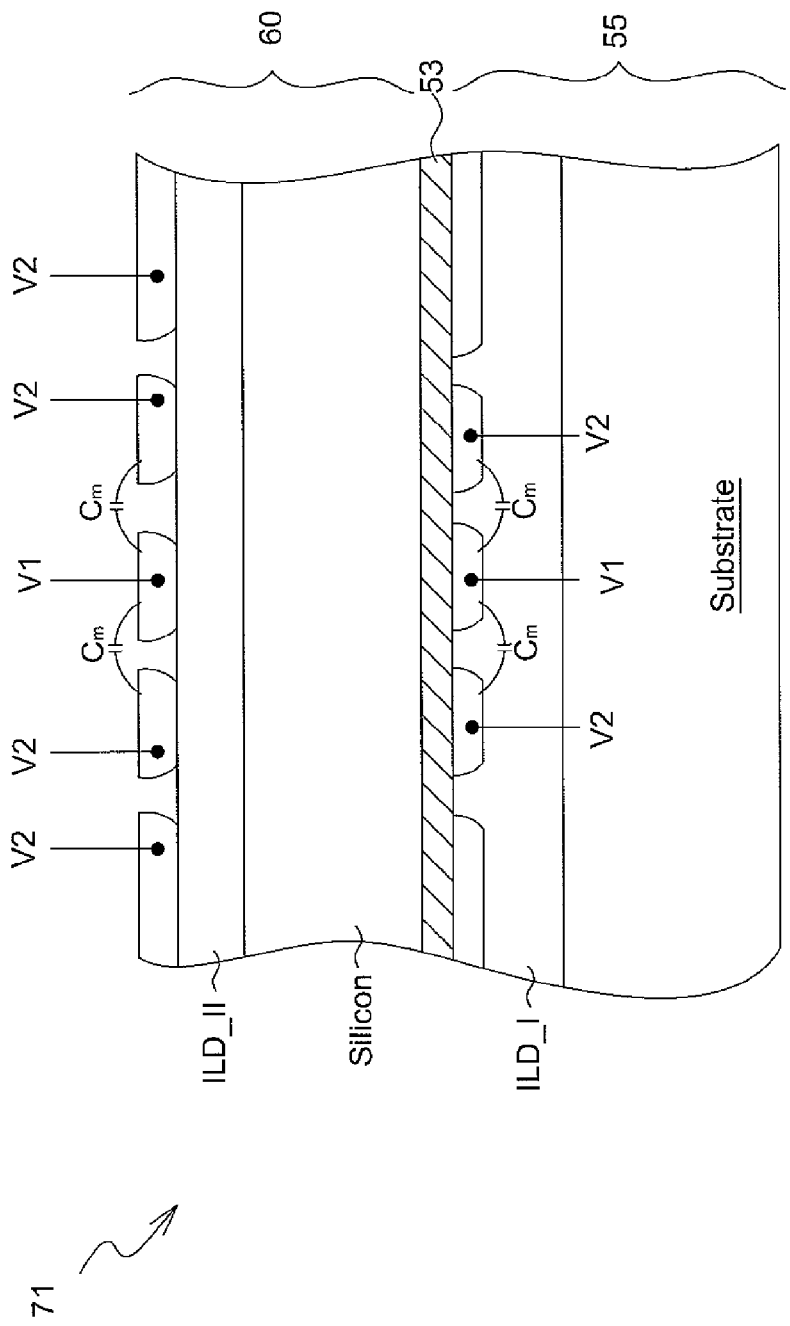

The measurement is repeated on reference TSV DUT 71, as shown in FIG. 12B. Reference TSV DUT 71 is substantially similar to target TSV DUT 70 just described, except to-be-measured TSVs 45 are removed in reference TSV DUT 71. It is shown in FIG. 12B that, under similar bias conditions, via capacitances $C_v$ no longer exist in reference TSV DUT 71. The method of making capacitance measurements on target and reference TSV DUTs, and the procedure of deriving desired via capacitance from the measurement results are substantially similar to those described previously in regard to ICs made of conventional vias. Furthermore, the measures taken to reduce measurement errors, such as DUT split described earlier, are also used in the current embodiment, and will not be described again.

Although the present invention and its advantages have been described in detail, it should be understood that various changes, substitutions and alterations can be made herein without departing from the spirit and scope of the invention as defined by the appended claims. For example, the via capacitance test structures and methods of making the desired measurement are disclosed through embodiments having vias formed between the first and the second interconnect layer in an IC. It can be well appreciated that the inventive features can be readily used in making capacitance measurement on vias between any two different interconnect layers in an IC. As another example, the configurations of the various DUTs used in the preferred embodiments should not be limited to those disclosed above. Other DUT configurations suitable for making the desired measurement should be within the scope of the current invention so long as the following inventive features are present. First, a target contact or via DUT includes a large number of duplicate to-be-measured contact or via so that the aggregate capacitance can be measured with desired precision. Secondly, a reference DUT and a target DUT are substantially similar, except the to-be-measured contact or via are removed from the reference DUT. And thirdly, a to-be-measured contact or via capacitance can be extracted from measurement results on a reference DUT and a target DUT.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention.

Accordingly, the appended claims are intended to include within their scope such processes, machines, manufacture, compositions of matter, means, methods, or steps.

What is claimed is:

1. A test structure formed on a semiconductor substrate for measuring the parasitic capacitance between a via and adjacent conductive features of a semiconductive device, said test structure comprising:
    said semiconductor substrate;
    a first conductive element having a first regularly repeating pattern, formed in a first metal layer over the substrate;
    a second conductive element having a second regularly repeating pattern, formed in the first metal layer over the substrate and electrically isolated from the first conductive element;
    a third conductive element, having a third regularly repeating pattern, formed in a second metal layer over the substrate;
    a fourth conductive element, having a fourth regularly repeating pattern, formed in the second metal layer and electrically isolated from the third conductive element, wherein said respective first, second, third, and fourth regularly repeating patterns comprise a comb structure;
    a first pattern of regularly spaced vias electrically connecting the first and fourth conductive elements; and
    a second pattern of regularly spaced vias electrically connecting the second and third conductive elements.

2. The test structure of claim 1, wherein the first pattern of regularly spaced vias are located at regions where fingers of the fourth conductive element overlay fingers of the first conductive element and the second pattern of regularly spaced vias are located at regions where fingers of the third conductive element overlay fingers of the second conductive element.

3. The test structure of claim 1, further comprising a first dielectric layer isolating the first and second conductive elements from the substrate and a second dielectric layer isolating the first and second conductive elements from the third and fourth conductive elements.

4. The test structure of claim 1, further comprising a first test probe pad coupled to the first and fourth conductive elements and a second test probe pad coupled to the second and third conductive elements.

5. The test structure of claim 1, wherein the first regularly repeating pattern corresponds to a minimum spacing design rule.

6. A test structure formed on a semiconductor substrate for measuring the parasitic capacitance between a via and adjacent conductive features of a semiconductive device, said test structure comprising:
    a grid of equally spaced conductive elements,
    a first plurality of the conductive elements being formed in a first plane, being substantially aligned in a first direction, and being electrically connected to one another;
    a second plurality of the conductive elements being formed in the first plane, being substantially aligned in the first direction, being electrically connected to one another, and being electrically isolated from the first plurality of conductive elements;
    a third plurality of the conductive elements being formed in a second plane, above the first plane, being substantially aligned in a second direction, and being electrically connected to one another;
    a fourth plurality of the conductive elements being formed in the second plane, being substantially aligned in the first direction, and being electrically connected to one another, and being electrically isolated from the third plurality of conductive elements;
    a first plurality of vias electrically connecting the first plurality of conductive elements with the fourth plurality of conductive elements at points where the fourth plurality of conductive elements overlaps the first plurality of conductive vias;
    a second plurality of vias electrically connecting the second plurality of conductive elements with the third plurality of conductive elements at points where the third plurality of conductive elements overlaps the second plurality of conductive vias;
    a first test probe pad connected to the first and fourth plurality of conductive elements; and
    a second test probe pad connected to the second and third plurality of conductive elements.

7. The test structure of claim 6, wherein the first plurality of conductive elements form a comb structure and the second plurality of conductive elements form a complementary comb structure and wherein the third plurality of conductive elements form a comb structure and the fourth plurality of conductive elements form a complementary comb structure.

8. The test structure of claim 6, wherein the first plurality of vias and the second plurality of vias comprises 10,000 vias.

9. The test structure of claim 6, further comprising a common conductive element electrically connecting each of the first plurality of conductive elements and being aligned substantially orthogonally to the first plurality of conductive elements.

10. The test structure of claim 6, wherein the first direction is orthogonal to the second direction.

11. The test structure of claim 6, wherein the first plurality of vias and the second plurality of vias are formed in a dielectric layer.

* * * * *

UNITED STATES PATENT AND TRADEMARK OFFICE
CERTIFICATE OF CORRECTION

PATENT NO. : 8,115,500 B2
APPLICATION NO. : 13/015117
DATED : February 14, 2012
INVENTOR(S) : Doong et al.

Page 1 of 1

It is certified that error appears in the above-identified patent and that said Letters Patent is hereby corrected as shown below:

In Col. 16, line 15, claim 6, delete "first" and insert --second--.

Signed and Sealed this
Twenty-ninth Day of May, 2012

David J. Kappos
*Director of the United States Patent and Trademark Office*